(12) United States Patent
Chen et al.

(10) Patent No.: US 12,154,875 B2
(45) Date of Patent: Nov. 26, 2024

(54) PACKAGE AND METHOD OF FABRICATING THE SAME

(71) Applicant: Taiwan Semiconductor Manufacturing Company, Ltd., Hsinchu (TW)

(72) Inventors: Ming-Fa Chen, Taichung (TW); Chao-Wen Shih, Hsinchu County (TW); Tzuan-Horng Liu, Taoyuan (TW); Jen-Li Hu, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/164,646

(22) Filed: Feb. 6, 2023

(65) Prior Publication Data
US 2023/0187391 A1  Jun. 15, 2023

Related U.S. Application Data

(63) Continuation of application No. 16/924,216, filed on Jul. 9, 2020, now Pat. No. 11,587,894.

(51) Int. Cl.
*H01L 23/00* (2006.01)
*H01L 21/768* (2006.01)
*H01L 23/522* (2006.01)
*H01L 23/64* (2006.01)

(52) U.S. Cl.
CPC ........ *H01L 24/05* (2013.01); *H01L 21/76807* (2013.01); *H01L 23/5222* (2013.01); *H01L 23/5226* (2013.01); *H01L 23/645* (2013.01); *H01L 24/03* (2013.01); *H01L 2924/1205* (2013.01); *H01L 2924/1206* (2013.01)

(58) Field of Classification Search
CPC ........ H01L 24/05; H01L 24/03; H01L 24/19; H01L 24/80; H01L 21/76807; H01L 23/5222; H01L 23/5226; H01L 23/645; H01L 23/481; H01L 23/5223; H01L 23/5227; H01L 2924/1205; H01L 2924/1206; H01L 25/105; H01L 25/0657; H01L 25/50
See application file for complete search history.

(56) References Cited

U.S. PATENT DOCUMENTS

| | | | |
|---|---|---|---|
| 8,993,380 B2 | 3/2015 | Hou et al. | |
| 9,281,254 B2 | 3/2016 | Yu et al. | |
| 9,299,649 B2 | 3/2016 | Chiu et al. | |
| 9,372,206 B2 | 6/2016 | Wu et al. | |
| 9,425,126 B2 | 8/2016 | Kuo et al. | |
| 9,443,783 B2 | 9/2016 | Lin et al. | |
| 9,461,018 B1 | 10/2016 | Tsai et al. | |
| 9,496,189 B2 | 11/2016 | Yu et al. | |
| 9,666,502 B2 | 5/2017 | Chen et al. | |
| 9,735,131 B2 | 8/2017 | Su et al. | |
| 2016/0372449 A1* | 12/2016 | Rusu | H01L 28/40 |

(Continued)

*Primary Examiner* — Dao H Nguyen
(74) *Attorney, Agent, or Firm* — JCIPRNET

(57) ABSTRACT

Provided is packages and method of fabricating the same. The package includes a first die, a second die, and an inductor. The second die is bonded to the first die through a bonding structure thereof. The inductor is located in the bonding structure. The inductor includes a spiral pattern parallel to top surfaces of the first die and the second die, and the spiral pattern includes at least a turn.

20 Claims, 34 Drawing Sheets

(56) References Cited

U.S. PATENT DOCUMENTS

| | | | |
|---|---|---|---|
| 2017/0221858 A1* | 8/2017 | Yu | H01L 27/0688 |
| 2019/0148342 A1* | 5/2019 | Hu | H01L 25/105 257/659 |
| 2020/0075553 A1* | 3/2020 | Delacruz | H01F 17/0013 |
| 2020/0402951 A1* | 12/2020 | Chen | H01L 24/03 |

* cited by examiner

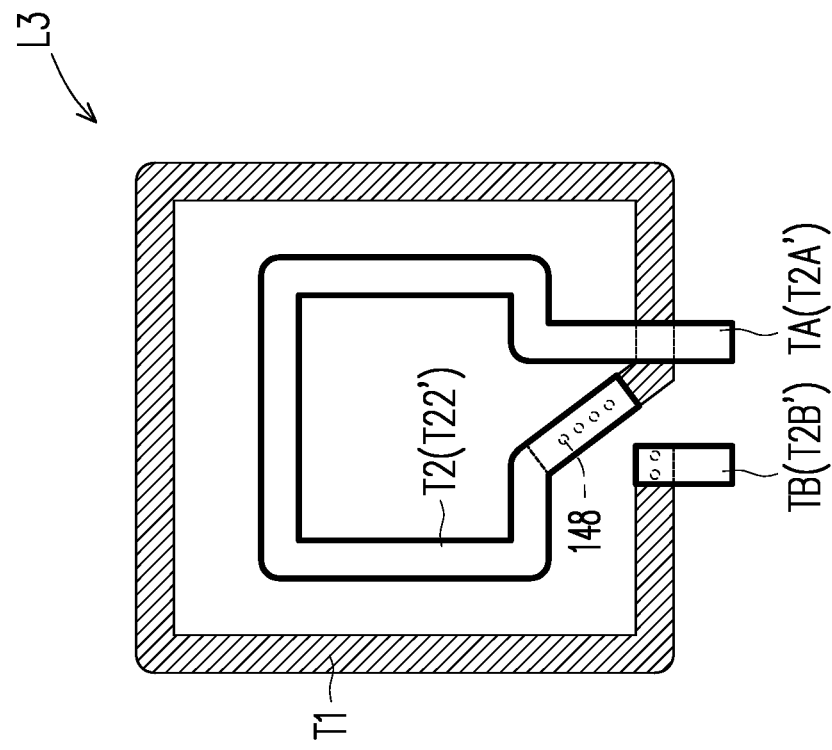
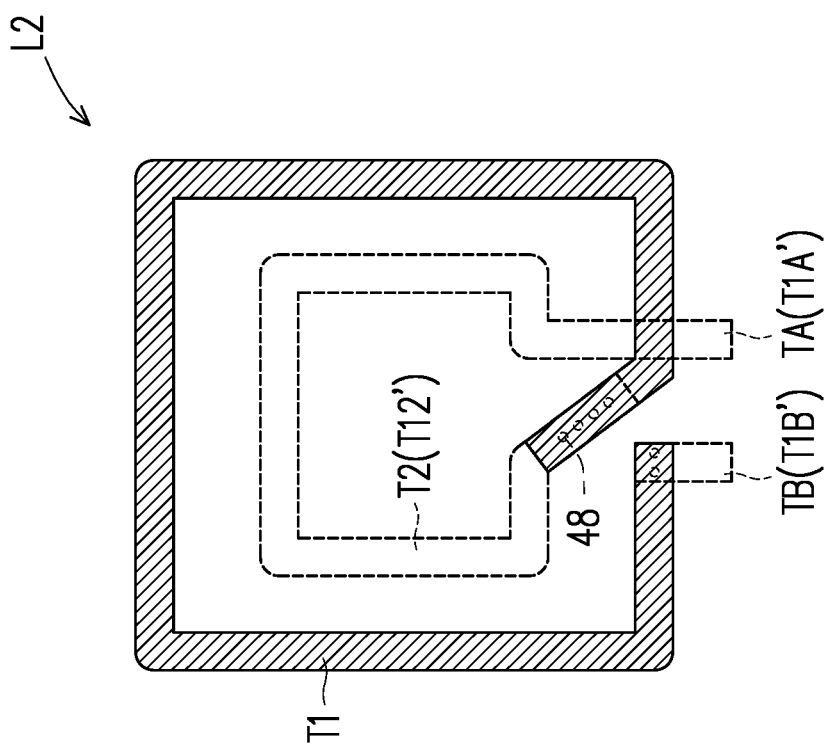
FIG. 4E
FIG. 4D

PACKAGE AND METHOD OF FABRICATING THE SAME

CROSS-REFERENCE TO RELATED APPLICATION

This application is a continuation application of and claims the priority benefit of a prior application Ser. No. 16/924,216, filed on Jul. 9, 2020, now allowed. The entirety of each of the above-mentioned patent applications is hereby incorporated by reference herein and made a part of this specification.

BACKGROUND

The packages of integrated circuits are becoming increasing complex, with more device dies packaged in the same package to achieve more functions. For example, a package structure has been developed to include a plurality of device dies such as processors and memory cubes in the same package. The package structure may include device dies formed using different technologies and have different functions bonded to the same device die, thus forming a system. This may save manufacturing cost and optimize device performance.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 4B, 4D, 4E, and 4G illustrate top views of the components including inductors in accordance with some embodiments of the present disclosure.

DETAILED DESCRIPTION

Figure 1A:
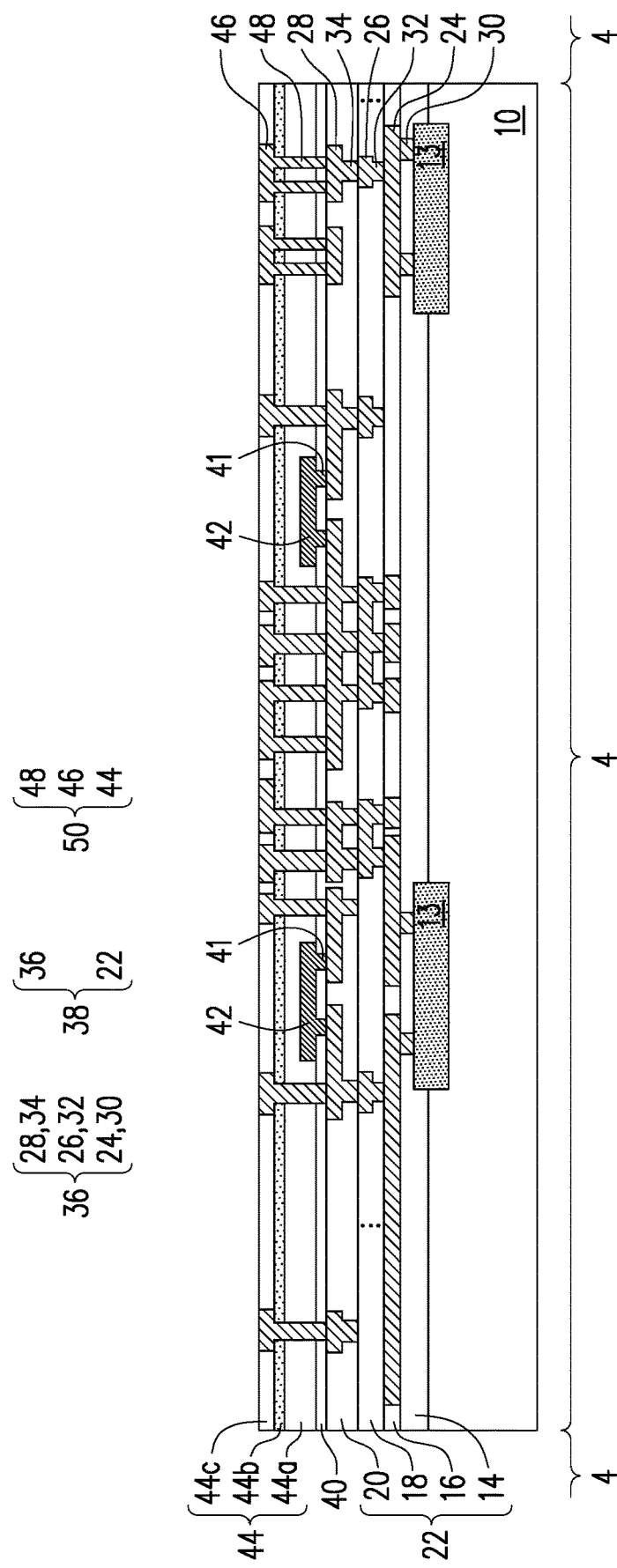
FIGS. 1A through 1H are cross-sectional views of intermediate stages in the manufacturing of a package having device dies bonded through face-to-face bonding in accordance with some embodiments of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

A package and the method of forming the same are provided in accordance with various exemplary embodiments. The intermediate stages of forming the package are illustrated in accordance with some embodiments. Some variations of some embodiments are discussed. Throughout the various views and illustrative embodiments, like reference numbers are used to designate like elements.

FIGS. 1A through 1H illustrate the cross-sectional views of intermediate stages in the formation of a package in accordance with some embodiments of the present disclosure.

FIG. 1A illustrates the cross-sectional view of a wafer 2. In some embodiments, the wafer 2 is a semiconductor wafer including active devices such as transistors and/or diodes, and possibly passive devices such as capacitors, inductors, resistors, or the like. The wafer 2 may include a plurality of chips 4 therein, with one of chips 4 illustrated. The chips 4 are alternatively referred to as (device) dies hereinafter. In some embodiments, the device die 4 is a logic die, which may be a central processing unit (CPU) die, a micro control unit (MCU) die, an input-output (IO) die, a baseband (BB) die, an application processor (AP) die, or the like. The device die 4 may also be a memory die such as a dynamic random access memory (DRAM) die or a static random access memory (SRAM) die, or may be other types of dies. In subsequent discussion, a device wafer is discussed as an exemplary of the wafer 2. The embodiments of the present disclosure may also be applied to other types of package components such as interposer wafers.

In some embodiments, the wafer 2 includes the substrate 10 and the features formed at a top surface of the substrate 10. The substrate 10 may be a semiconductor substrate, such as a bulk semiconductor, a semiconductor-on-insulator (SOI) substrate, a semiconductor on sapphire substrate, other supporting substrate (e.g., quartz, glass, etc.), combinations thereof, or the like, which may be doped or undoped. In some embodiments, the substrate 10 is made of silicon or other semiconductor materials. Alternatively, the substrate 10 includes other elementary semiconductor materials such as germanium, gallium arsenic, or other suitable semiconductor materials. In some embodiments, the substrate 10 may further include other features such as various doped regions, buried layers, and/or epitaxy layers. Moreover, in some embodiments, the substrate 10 is made of an alloy semiconductor such as silicon germanium, silicon germanium carbide, gallium arsenic phosphide, or gallium indium phosphide. Shallow trench isolation (STI) regions (not shown) may be formed in the substrate 10 to isolate the active regions in the substrate 10. Although not shown, through-vias may be formed to extend into the substrate 10, and the through-vias are used to electrically inter-couple the features on opposite sides of the wafer 2.

In some embodiments, the wafer 2 includes integrated circuit devices 13. The integrated circuit devices 13 are formed on the top surface of the substrate 10 in a front-end-of-line (FEOL) process. The integrated circuit devices 13 may be active and/or passive devices. The integrated circuit devices 13 may include N-type metal-oxide semiconductor (NMOS), P-type metal-oxide semiconductor (PMOS) and/or complementary metal-oxide semiconductor (CMOS) transistors, resistors, capacitors, diodes, and/or the like. The details of the integrated circuit devices 13 are not illustrated herein. In accordance with alternative embodiments, the wafer 2 is used for forming interposers, in which the substrate 10 may be a semiconductor substrate or a dielectric substrate.

In some embodiments, the wafer 2 may further include an interconnect structure 38. The interconnect structure 38 is formed over the substrate 10. The interconnect structure 38 includes a dielectric structure 22 and an interconnect 36 in the dielectric structure 22. The dielectric structure 22 includes an inter-layer dielectric (ILD) layer 14, and inter-metal dielectric (IMD) layers 16, 18, and 20. The interconnect 36 includes contact plugs 30, and vias 32 and 34, and metal lines 24, 26 and 28.

The ILD layer 14 is formed over the substrate 10, and fills the space between the gate stacks of transistors (not shown) in the integrated circuit devices 13. In accordance with some exemplary embodiments, the ILD layer 14 is formed of phospho-silicate glass (PSG), boro-silicate glass (BSG), boron-doped phosphosilicate glass (BPSG), fluorine-doped silicate glass (FSG), tetra ethyl ortho silicate (TEOS), or the like. The ILD layer 14 may be formed using spin coating, flowable chemical vapor deposition (FCVD), chemical vapor deposition (CVD), plasma enhanced chemical vapor deposition (PECVD), low pressure chemical vapor deposition (LPCVD), or the like.

The contact plugs 30 are formed in the ILD layer 14, and are used to electrically connect the integrated circuit devices 13 to overlying metal lines 24. In some embodiments, the contact plugs 30 are formed of a conductive material metal, metal alloy, the like or combinations thereof, such as tungsten, aluminum, copper, titanium, tantalum, titanium nitride, tantalum nitride, and/or multi-layers thereof. The formation of the contact plugs 30 may include forming contact openings in the ILD layer 14, filling a conductive material(s) into the contact openings, and performing a planarization (such as chemical mechanical polish (CMP) process) to level the top surfaces of the contact plugs 30 with the top surface of the ILD layer 14.

The IMD layers 16, 18 and 20, the metal lines 24, 26 and 28, and vias 32 and 34 are formed over the ILD layer 14 and the contact plugs 30. In some embodiments, at least a lower layer in the IMD layers 16, 18 and 20 is formed of a low-k dielectric material having a dielectric constant (k-value) lower than about 3.0 or lower than about 2.5. The IMD layers 16, 18 and 20 may be formed of black diamond (a registered trademark of Applied Materials), a carbon-containing low-k dielectric material, hydrogen silsesquioxane (HSQ), methylsilsesquioxane (MSQ), or the like. In accordance with alternative embodiments of the present disclosure, some or all of dielectric layers 16, 18 and 20 are formed of non-low-k dielectric materials such as silicon oxide, silicon carbide (SiC), silicon carbo-nitride (SiCN), silicon oxy-carbo-nitride (SiOCN), or the like. In some embodiments, the formation of dielectric layers 16, 18 and 18 includes depositing a porogen-containing dielectric material, and then performing a curing process to drive out the porogen, and hence the remaining dielectric layers 16, 18 and 20 becomes porous. Etch stop layers (not shown), which may be formed of silicon carbide, silicon nitride, or the like, are formed between IMD layers 16, 18 and 20, and are not shown for simplicity.

The metal lines 24, 26 and 28, and vias 32 and 34 are formed in the IMD layers 16, 18 and 20. The metal lines 24, 26 and 28 at a same level are collectively referred to as a metal layer hereinafter. In some embodiments, the interconnect structure 38 includes a plurality of metal layers that are interconnected through vias. The metal lines 24, 26 and 28, and vias 32 and 34 may be formed of copper, a copper alloy, silver, gold, tungsten, tantalum, aluminum, a combination thereof, or the like. The formation process may include single damascene and dual damascene processes. In an exemplary single damascene process, a trench is first formed in one of the IMD layers 16, 18 and 20, followed by filling the trench with a conductive material. A planarization process such as a CMP process is then performed to remove the excess portions of the conductive material higher than the top surface of the IMD layer, leaving a metal line in the trench. In a dual damascene process, both a trench and a via opening are formed in an IMD layer. The via opening is underlying and in spatial communicated with-the trench. The conductive material is then filled into the trench and the via opening to form a metal line and a via, respectively. The conductive material may include a diffusion barrier and a copper-containing metallic material over the diffusion barrier. The diffusion barrier may include titanium, titanium nitride, tantalum, tantalum nitride, or the like.

The metal lines 28 are sometimes referred to as top metal lines. The top metal lines 28 are also collectively referred to as being a top metal layer 28'. The IMD layer 20 is also referred to as top IMD layer. The respective IMD layer 16, 18 or 20 may be formed of a non-low-k dielectric material such as undoped silicate glass (USG), silicon oxide, silicon nitride, or the like. The IMD layer 16, 18 or 20 may also be formed of a low-k dielectric material, which may be selected from the similar materials of the underlying dielectric layer.

In some embodiments, the wafer 2 may further include a passivation layer 40 and a metal pad 42. The passivation layer 40 are formed over the top metal layer and the IMD layer 20. In some embodiments, the passivation layer 40 includes silicon oxide, silicon nitride, benzocyclobutene (BCB) polymer, polyimide (PI), polybenzoxazole (PBO) or a combination thereof and is formed by a suitable process such as spin coating, CVD or the like.

The metal pad 42 is formed on the passivation layer 40 and electrically connected to the top metal lines 28 through vias 41. The metal pad 42 may be electrically coupled to the one or more integrated circuit devices 13 through the vias 41 and the interconnect 36. In some embodiments, the metal pads 42 include a metal material, such as aluminum, copper, nickel, gold, silver, tungsten, or a combination thereof. The metal pad 42 may be formed by depositing a metal material layer through a suitable process such as electro-chemical plating process, CVD, atomic layer deposition (ALD), PVD or the like, and then patterning the metal material layer. The device die 4 is a known good die (KGD). That is, a die performance test is conducted to the metal pad 40 to identify or select known good die. In some embodiments, the die performance test is conducted by using a die performance probe (not shown) inserted into the metal pad 42, and hence the metal pad 40 may be referred to as test pads.

Figure 5:
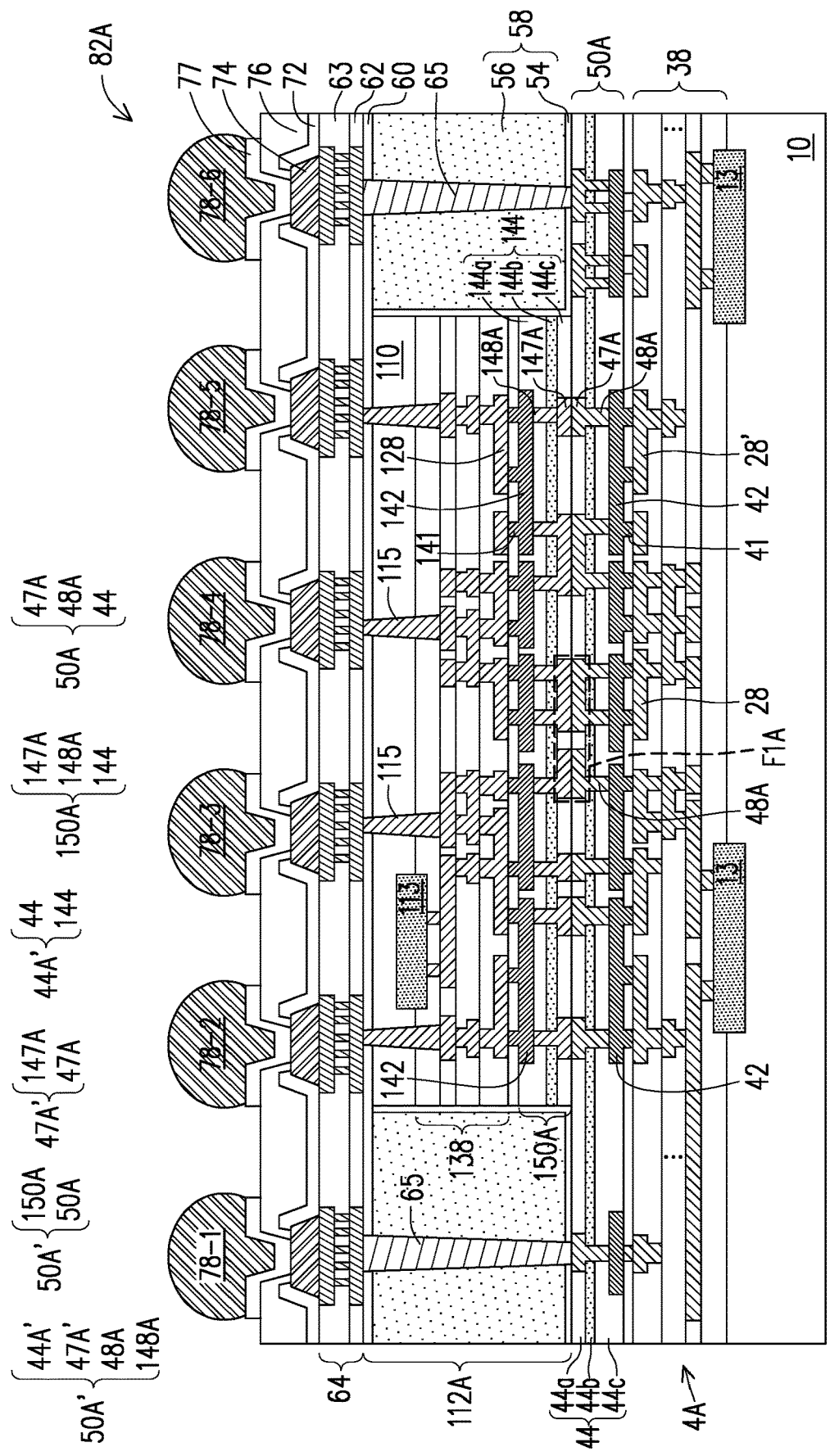
FIG. 5 is a cross-sectional view of intermediate stages in the manufacturing of a package having device dies bonded through face-to-face bonding in accordance with alternative embodiments of the present disclosure.
Figure 6:
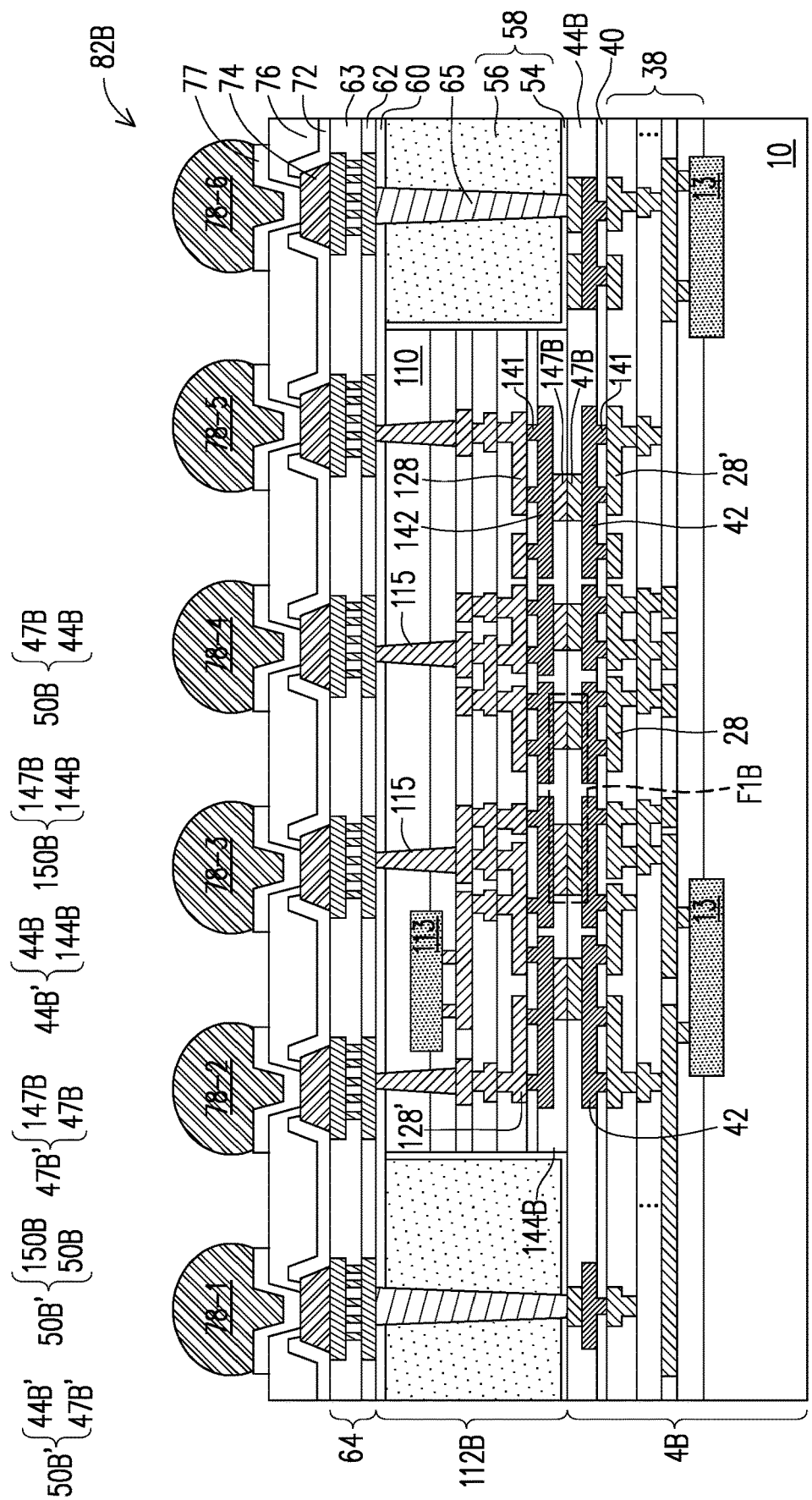
FIG. 6 is a cross-sectional view of intermediate stages in the manufacturing of a package having device dies bonded through face-to-face bonding in accordance with other some embodiments of the present disclosure.

A bonding layer 50 is formed on the metal pad 42 and the passivation layer 40. The bonding layer 50 includes an insulating layer 44, and bond pads 46 in the insulating layer 44. In some embodiments, the bond pads 46 are in direct electrical contact with vias 48 formed in the insulating layer 44 to electrically connect to the top metal layer 28'. In alternative embodiments, the bond pads 46 are electrically connected to the metal pads 42 through vias 48A, or in physical contact with the metal pads 42 (as shown in FIGS. 5 and 6).

The insulating layer 44 may include one or more layers of non-photo-patternable insulating materials such as silicon nitride, silicon oxide, phosphosilicate glass (PSG), borosilicate glass (BSG), boron-doped phosphosilicate glass (BPSG), a combination thereof, or the like, and may be formed using CVD, PVD, ALD, a spin-on coating process, a combination thereof, or the like. In some embodiments, the insulating layer 44 may include insulating material layers 44a, 44b and 44c, from bottom to up. The material of the insulating material layer 44b may be different from the material of the insulating material layers 44a and 44c to serve as an etch stop layer during the subsequent etching process. In some embodiments, the insulating layer 44 is planarized using a CMP process, a grinding process, an etching process, a combination thereof, or the like. In some embodiments, the insulating layer 44 and the underlying dielectric layer may include a same material. In other embodiments, the insulating layer 44 and the underlying dielectric layer may include different materials.

In some embodiments, the bond pads 46, and the vias 48 may include a conductive material such as aluminum, copper, tungsten, silver, gold, a combination thereof, or the like. In some embodiments, a conductive material may be formed over the interconnect structure using, for example, PVD, ALD, electro-chemical plating, electroless plating, a combination thereof, or the like. Subsequently, the conductive material is patterned to form the contact pads using suitable photolithography and etching methods. The bond pads 46, and the vias 48 may be formed in the insulating layer 44 using, for example, a single damascene process, a dual damascene process, a combination thereof, or the like.

In a dual damascene process, both a trench and a via opening are formed in the bonding layer. The trench may have various shapes. In some embodiments, the trench has a dot shape. In alternative embodiments, the trench has an elongated shape or a spiral shape, and extends parallel to the top surface of the substrate 10. The via opening is perpendicular to the top surface of the substrate 10, and is below and in spatial communicates with the trench. The conductive material is then filled into the trench and the via opening to form a bond pads in the trench and a via in the via opening, respectively. In some embodiments, the bond pads 46, and the vias 48 may be formed using a dual damascene process, which includes forming via openings in the insulating layers 44b and 44c and the passivation layer 40, and trenches in the insulating layer 44c, and filling the trenches and the via openings with conductive materials. The filling of the conductive materials may include depositing a diffusion barrier such as a titanium nitride layer, a tantalum nitride layer, a titanium layer, a tantalum layer, or the like, and depositing a copper-containing material over the diffusion barrier. A planarization process such as a CMP process or a mechanical grinding process is performed to level the top surfaces of insulating layer 44, the bond pads 46, and the dummy pads 45. In other words, topmost surfaces of the bond pads 46 are substantially level or coplanar with a topmost surface of the insulating layer 44.

The bonding pads 46 may have various shapes as shown in FIGS. 2A, 3A, 4A, 4C, and 4F in accordance with the functions of the bonding pads 46, which will be described in detail later, but is not limited thereto.

Figure 1B:
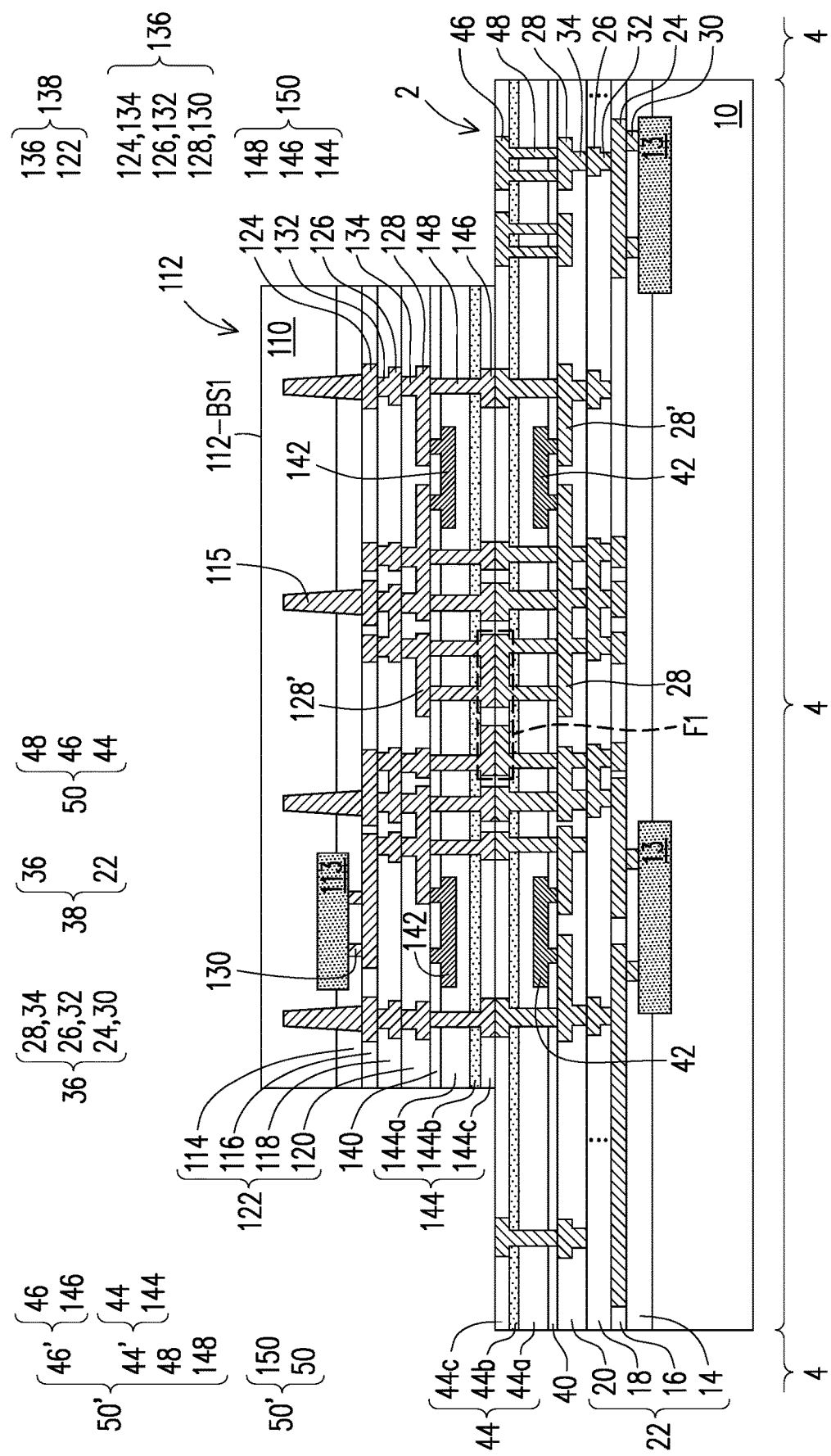

FIG. 1B illustrates the bonding of the device die 112 to the device die 4. In some embodiments, the device die 112 is a logic die, which may be a CPU die, a MCU die, an IO die, a baseband die, an AP die, or the like. The device dies 112 may also be a memory die. The device dies 112 are cut from a wafer, and the wafer may be probed and tested before singulating. After performing the singulation process, only known good dies 112 are provided for subsequent processes.

The device die 112 includes semiconductor substrate 110, which may be a silicon substrate. Conductive vias 115 are formed in the semiconductor substrate 110. In some embodiments, the device die 112 may be thinned by an initial thinning process before bonding to the device die 4. For example, the initial thinning process is performed to reduce the thickness of the device die 112 to a range of about 100 µm to about 150 µm, without revealing the conductive vias 13 of the device die 112. The conductive vias 115 are used to connect the devices 113 and metal lines formed on the front side (the illustrated bottom side) of semiconductor substrate 110 to the backside. The conductive via 115 includes a conductive post and a liner surrounding the sidewalls and bottom surface of the conductive via to separate the conductive post from the substrate. The conductive post may include copper, copper alloys, aluminum, aluminum alloys, Ta, TaN, Ti, TiN, CoW or combinations thereof. The liner may include dielectric material, such as silicon oxide, silicon nitride, or the like.

Also, the device die 112 includes a interconnect structure 138 on the substrate 110. The interconnect structure 138 includes a dielectric structure 122 and an interconnect 136 in the dielectric layer 122. The interconnect 136 including metal lines and vias (not shown) for connecting to the active devices and/or the passive devices and the conductive vias 115 in the device die 112.

The device die 112 may include a passivation layer 140, a metal pad 142 and a bonding layer 150. The bonding layer 150 may include an insulating layer 144, bond pads 146, and vias 148. The insulating layer 144 may include insulating layers 144a, 144b, and 144c. The bond pads 146, and vias 148 are formed in the insulating layer 144. The materials and the formation methods of the passivation layer 140, the metal pad 142, the insulating layer 144, the bond pads 146, and the vias 148 may be similar to their corresponding parts in the device die 4, and hence the details are not repeated herein.

Figure 2A:
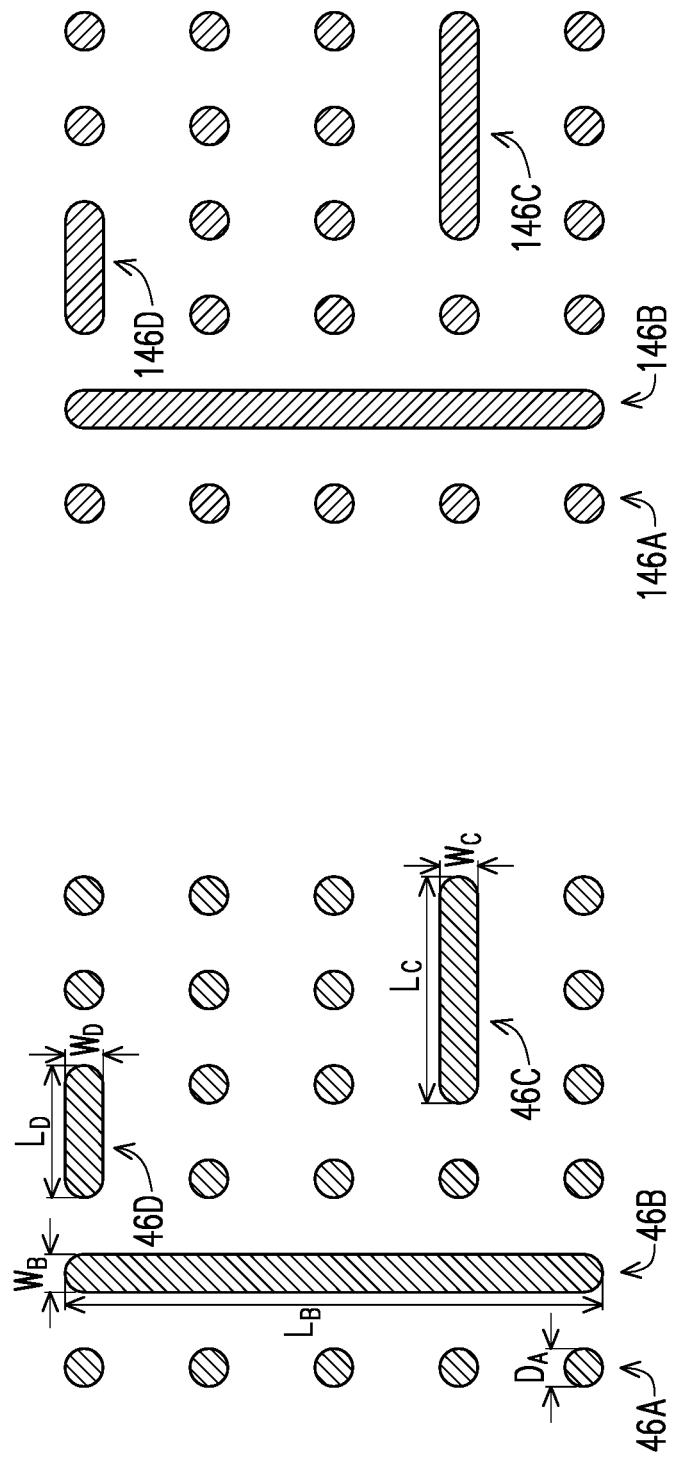
FIGS. 2A, 3A, 4A, 4C, and 4F illustrate top views of bonding layers illustrated in FIGS. 1A and 1H in accordance with alternative embodiments of the present disclosure.

Referring to FIG. 2A, the bonding pads 46 may include bonding pads 46A, 46B, 46C and 46D. The shapes of the bonding pads 46A, 46B, 46C and 46D correspond to combination shapes of the trenches formed in the in the insulating layers 44c and 144c (shown in FIG. 1B). The bonding pads 46A, 46B, 46C and 46D have difference shapes. In some embodiments, the bonding pad 46A has a dot shape, and the bonding pads 46B, 46C and 46D may have straight line shapes, polyline shapes or combinations thereof. In some embodiments, the bonding pads 46B, 46C, and 46D have straight line shapes. The bonding pads 46C and 46D extend in a same direction, and the bonding pads 46B and 46C extend in different directions. The bonding pads 46B, 46C and 46D may be separated from each other or adjacent each other. The bonding pads 46B, 46C and 46D may be arranged, for example, side-by-side, end-to-end, or end-to-side. The bonding pads 46B, 46C and 46D may be surround by the bonding pads 46A. The bonding pads 46A may be arranged at one, two, three, or four sides of the bonding pads 46B, 46C and 46D.

The bonding pads 46B, 46C and 46D have lengths $L_B$, $L_C$, and $L_D$ respectively. The lengths $L_B$, $L_C$, and $L_D$ may be the same or different, and greater than a diameter $D_A$ of the bonding pad 46A. A ratio of the length $L_B$, $L_C$, or $L_D$ to the diameter $D_A$ ranges, for example, form about 1 to about 100,000. The bonding pads 46B, 46C and 46D respectively have widths $W_B$, $W_C$, and $W_D$. The widths $W_B$, $W_C$, and $W_D$ of the bonding pads 46B, 46C and 46D and the diameter $D_A$ of the bonding pad 46A may be the same or different. A ratio of the width $W_B$, $W_C$, or $W_D$ to the diameter $D_A$ ranges, for example, form about 1 to about 100,000.

The bonding pad 46A may be in physical contact with one via 48 to electrically connect to the interconnect 36 (as shown in FIG. 1B). The bonding pads 46B, 46C and 46D may be in physical contact with one or more vias 48, respectively, to electrically connect to the top metal layer 28' of the interconnect 36 (as shown in FIG. 1B). In other words, the number of via 48 being in physical contact with the bonding pad 46B, 46C or 46D is equal to or greater than the number of via 48 being in physical contact with the bonding pad 46A.

Figure 3A:
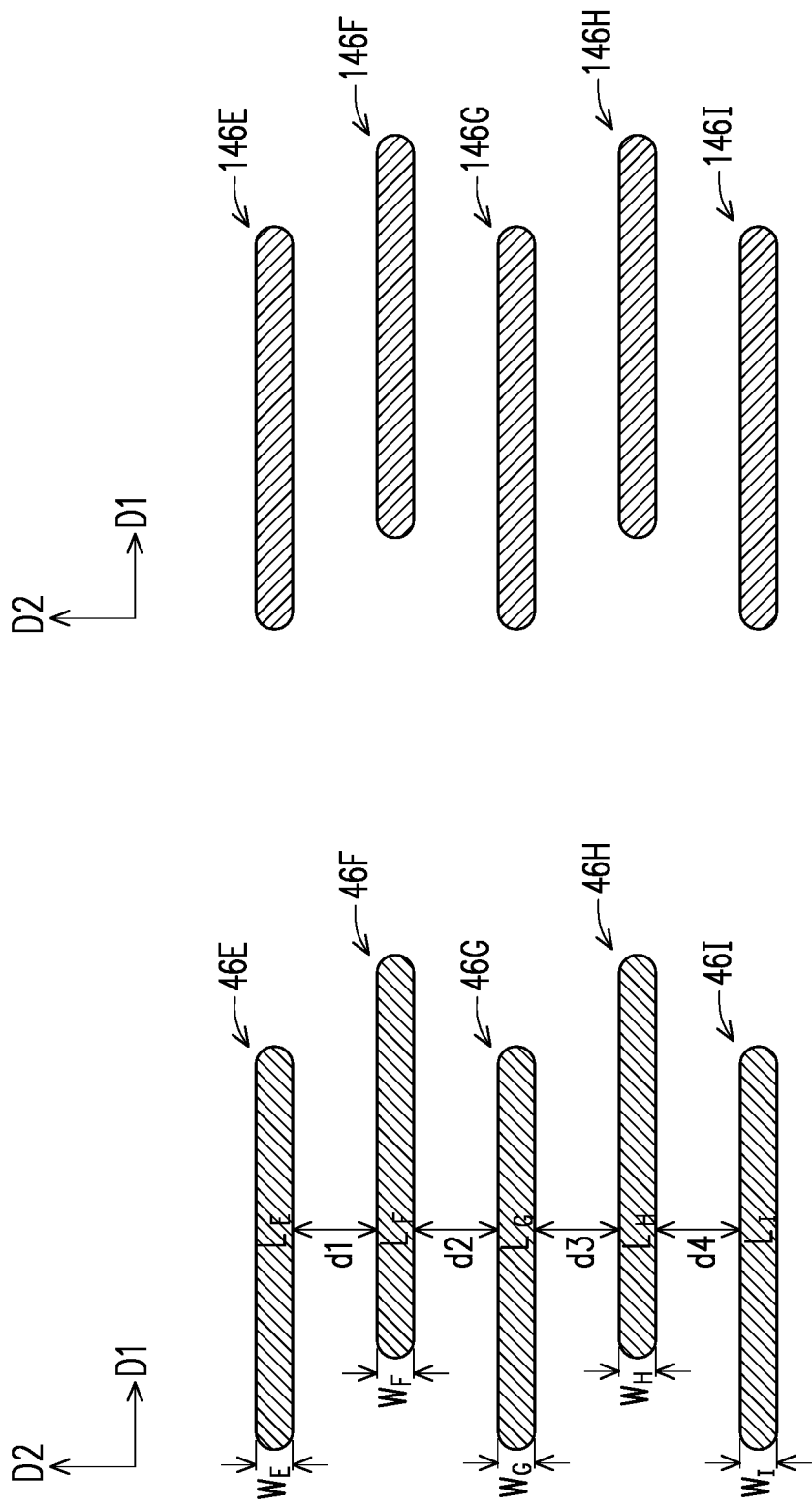

Referring to FIG. 3A, the bonding pads 46 may include bonding pads 46E, 46F, 46G, and 46H at a same level. The bonding pads 46E, 46F, 46G, 46H, and 46I have the same shape. In some embodiments, the bonding pads 46E, 46F, 46G, 46H, and 46I have an elongated shape respectively. The bonding pads 46E, 46F, 46G, 46H, and 46I extend in a first direction D1.

The bonding pads 46E, 46F, 46G, 46H, and 46I have lengths $L_E$, $L_F$, $L_G$, $L_H$, and $L_I$, and widths $W_E$, $W_F$, $W_G$, $W_H$, and $W_I$, respectively. The lengths $L_E$, $L_F$, $L_G$, $L_H$, and $L_I$ may be the same or different. The widths $W_E$, $W_F$, $W_G$, $W_H$, and $W_I$ may be the same or different. Ends of the bonding pads 46E, 46F, 46G, 46H, and 46I may be aligned (not shown), or not. A distance d1 between the bonding pads 46E and 46F, a distance d2 between the bonding pads 46F and 46G, a distance d3 between the bonding pads 6G and 46H, and a distance d4 between the bonding pads 46G and 46H may be the same or different. In some embodiments, the distances d2 and d4 are greater than the distances d1 and d3, respectively. The distance d2 is equal to the distance d4, and the distance d1 is equal to the distance d3, for example.

In some embodiments, the bonding pads 46E, 46F, 46G, 46H, and 46I are arranged in the second direction D2. The projection of the bonding pad 46E in a second direction D2 and the projection of the bonding pad 46F along the second direction D2 may partially overlap or completely overlap. The projection of the bonding pad 46G along the second direction D2 and the projection of the bonding pad 46H in the second direction D2 may partially overlap or completely overlap. The projection of the bonding pad 46F in the second direction D2 and the projection of the bonding pad 46G along the second direction D2 may partially overlap or completely not overlap. The projection of the bonding pad 46H along the second direction D2 and the projection of the bonding pad 46I in the second direction D2 may partially overlap or completely not overlap. The bonding pads 46E, 46F, 46G, 46H, and 46I may be in physical contact with one or more vias 48, respectively, to electrically connect to the top metal layer 28' of the interconnect 36 (as shown in FIG. 1B). The number of vias 48 being in physical contact with the bonding pad 46E, 46F, 46G, 46H, and 46I may be the same or different.

Figure 4A:
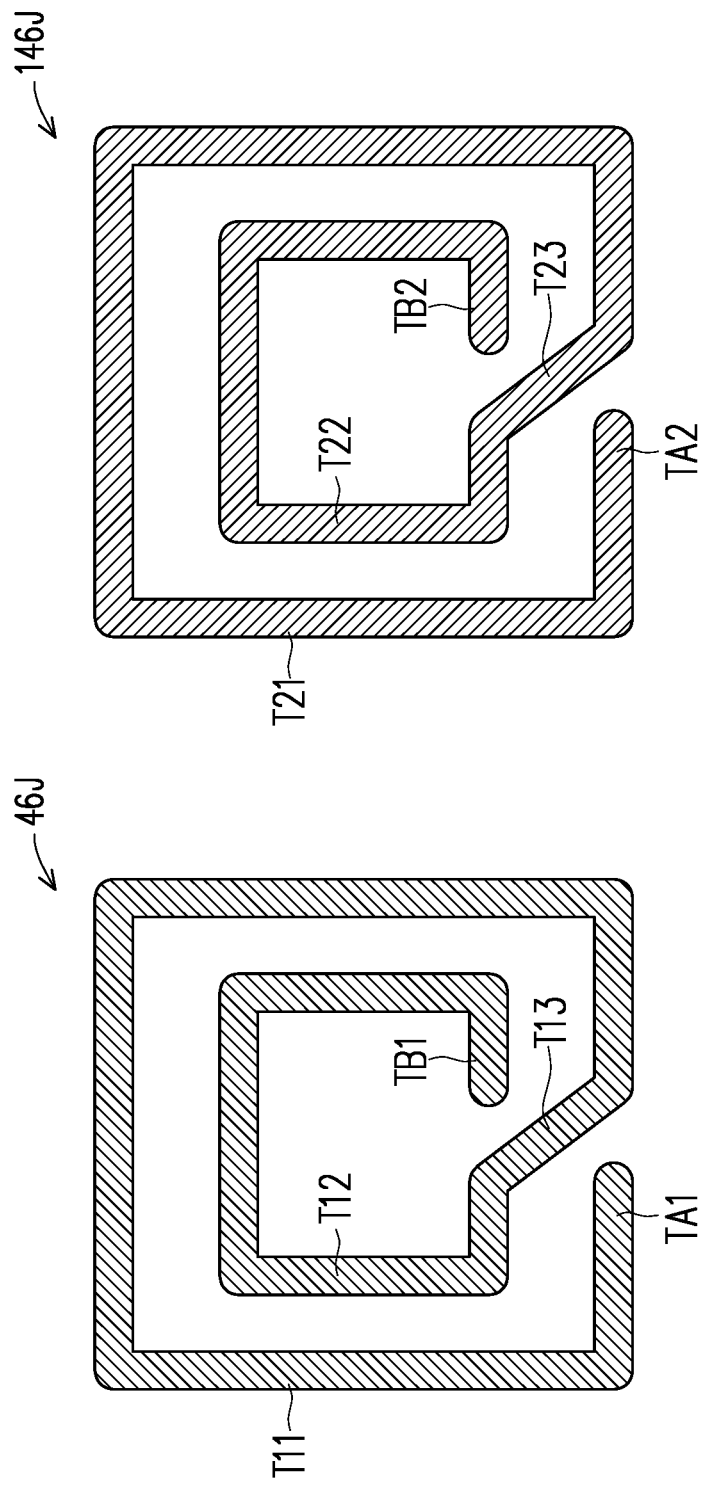

Referring to FIG. 4A, the bonding pad 46J has a spiral shape. The bonding pad 46J comprises a plurality of turns and a plurality of connection parts. In some embodiments, the bonding pad 46J comprises an outer turn T11, an inner turn T12 and a connection part T13. The outer turn T11, the inner turn T12, and the connection part T13 are coplanar. The outer turn T11 and the inner turn T12 are connected through the connection part T13. The outer turn T11 and the inner turn T12 may have the same or similar shape. The outer turn T11 and the inner turn T12 may be have square, polygonal, circular or elliptical shapes. The outer turn T11 has a terminal TA1, and the inner turn T12 has a terminal TB1. In some embodiments, both terminals TA1 and TB1 are coupled to two top metal lines 28 (as shown in FIG. 1B), which are separated from each other, through the vias 48. In alternative embodiments, one of the terminals TA1 and TB1 is coupled to the top metal line 28 through the vias 48, the other of the terminals TA1 and TB1 is coupled to a metal line 128 of a device die 112 shown in FIG. 1B. The top metal lines 28 and 128 may have turn shapes, for example.

Figure 4B:
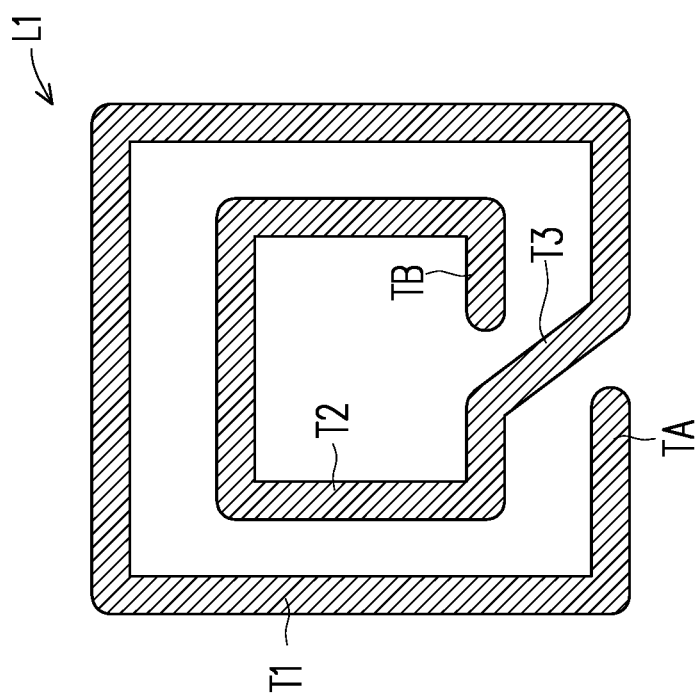
Figure 4C:
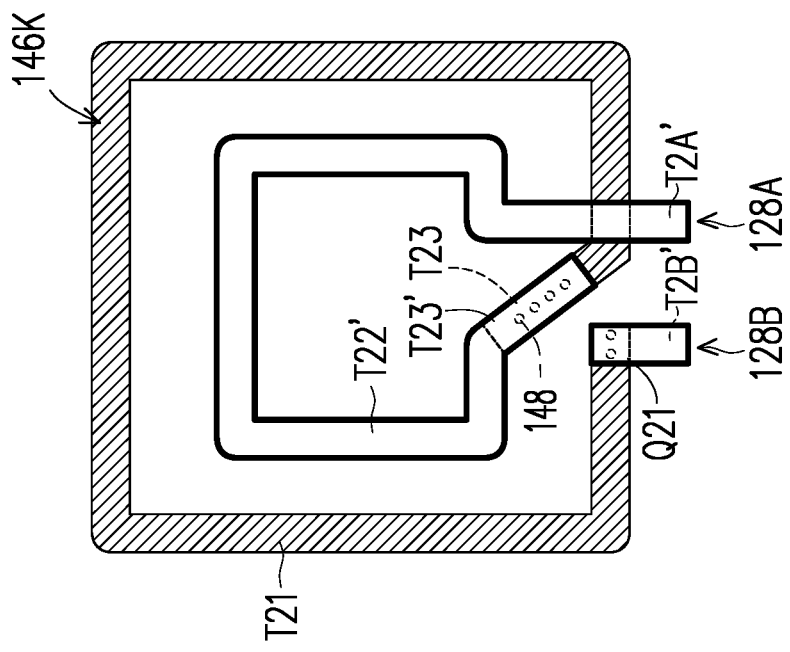
Figure 4C:
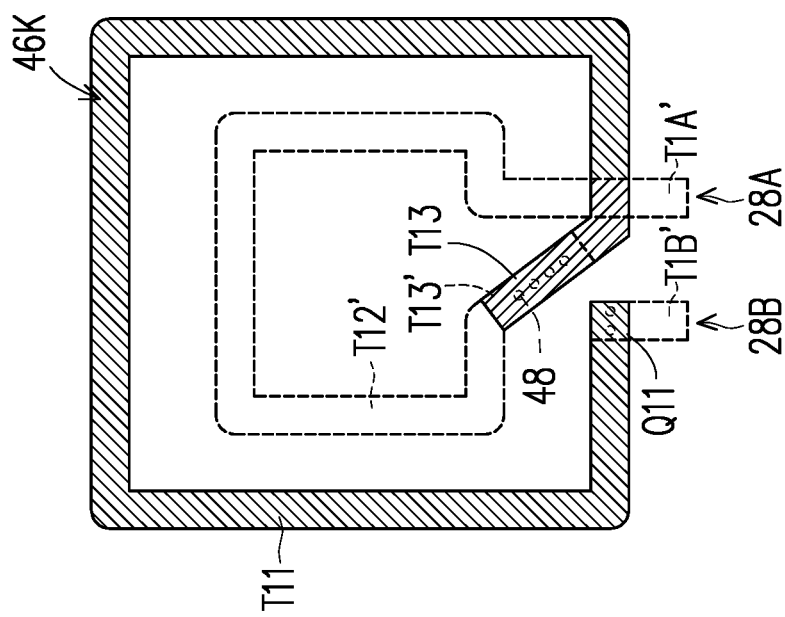
Figure 4F:
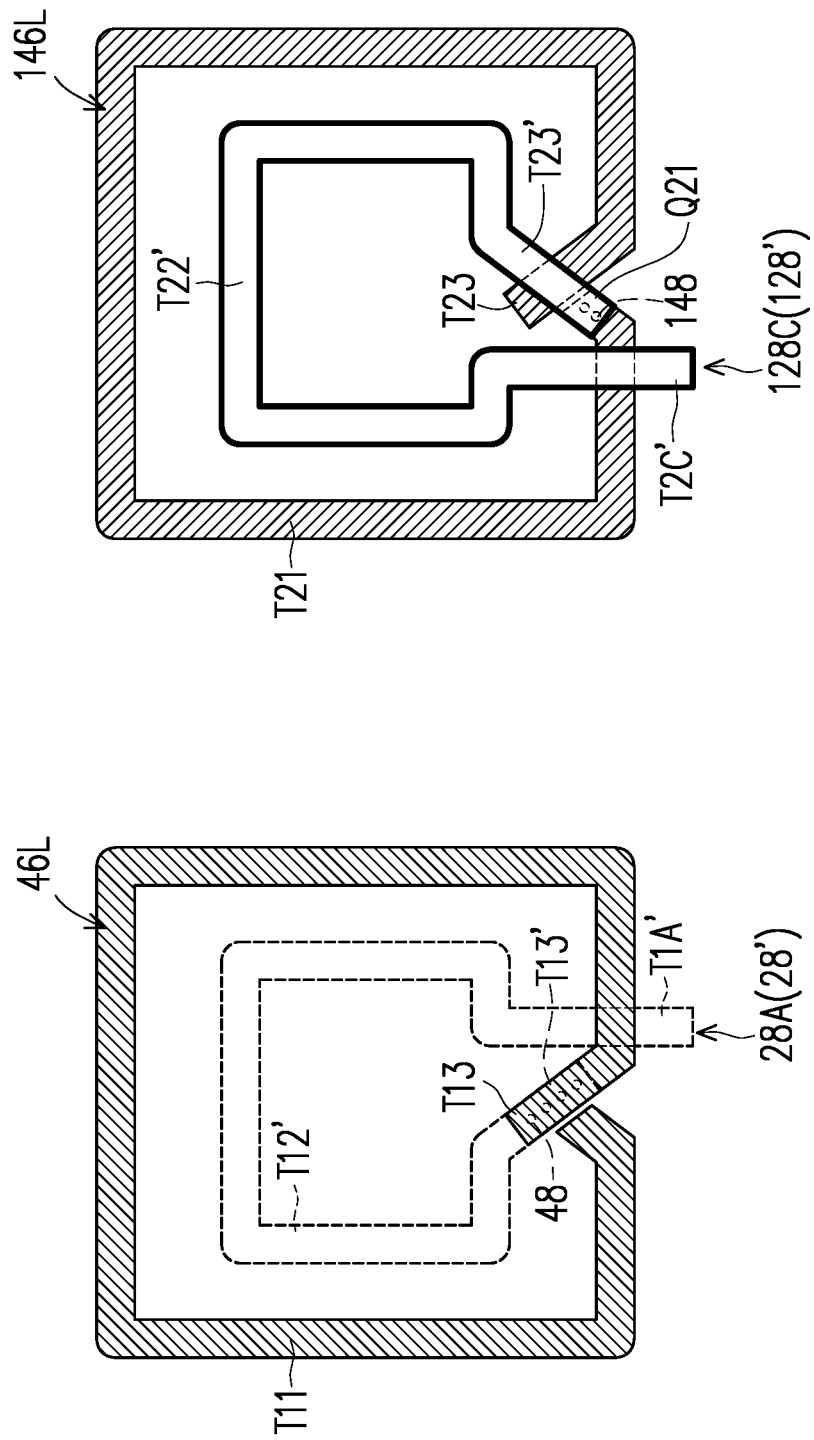

Referring to FIG. 4C, the bonding pad 46K comprises a turn T11 and a connection part T13 connected to the turn T11. In some embodiments, the top metal layer 28' comprises a top metal lines 28A and 28B separated from each other. The top metal line 28A comprises a turn T12', a terminal part T1A', and a connection part T13'. The turn T12' is between and connected to the connection part T13' and the terminal part T1A'. The connection part T13' of the top metal line 28A may be overlapped with the connection part T13 and connected to the connection part T13 of the bonding pad 46K through the vias 48. The top metal line 28B comprises a terminal part T1B' separated from the terminal part T1A' of the metal line 28A. The terminal part T1B' of the top metal line 28B is overlapped with a portion Q11 of the turn T11 and connected to the turn T11 of the bonding pad 46K through the other vias 48. In FIG. 4F, the bonding pad 46L is similar to the bonding pad 46K, the difference is that the top metal layer 28' comprises the top metal line 28A and is free from the top metal line 28B.

The bonding pads 146 of the device dies 112 may include bonding pads 146A, 146B, 146C, 146D, 146E, 146F, 146G, 146H, 146I, 146J, 146K and 146L having various shapes as shown in FIGS. 2A to 4A, 4C and 4E in accordance with the functions of the bonding pads 146. The shapes and sizes of the bonding pads 146A, 146B, 146C, 146D, 146E, 146F, 146G, 146H, 146I, and 146J may be the same as or similar to those of the bonding pads 46A, 46B, 146C, 46D, 46E, 46F, 46G, 46H, 46I, and 46J of the device die 4. For example, the bonding pad 146J comprises an outer turn T21, an inner turn T22 and a connection part T23. The outer turn T21, the inner turn T22, and the connection part T23 of the bonding pad 146J may be the same as or similar to those of the outer turn T11, the inner turn T12, and the connection part T13 (as shown in FIG. 4A). The shapes and sizes of the bonding pads 146K, and 146L may be similar to those of the bonding pads 46K, and 46L of the device die 4, and the difference is described hereafter.

Referring to FIG. 4C, the bonding pads 146K comprises a turn T21 and a connection part T23 connected to the turn T21. The shapes and sizes of the turn T21 and the connection part T23 are similar to the corresponding portions of the bonding pads 46K. The bonding pads 146K may be connected to the top metal layer 128', or may not be connected to the top metal layer 128'. In some embodiments, the top metal layer 128' comprises a top metal lines 128A and 128B separated each other. The top metal line 128A comprises a turn T22', a terminal part T2A', and a connection part T23', the turn T22' is between and connected to the connection part T23' and the terminal part T2A'. The connection part T23' of the top metal line 128A may be overlapped with the connection part T23 and connected to the connection part T23 of the bonding pad 146K through the vias 148. The top metal line 128B comprises a terminal part T2B' separated from the terminal part T2A' of the metal line 128A. The terminal part T2B' of the top metal line 28B is overlapped with a portion Q21 of the turn T21 and connected to the turn T21 of the bonding pad 146K through the other vias 148.

Referring to FIG. 4F, in alternative embodiments, the bonding pad 146L is similar to the bonding pad 146K, the difference is that the top metal layer 128' comprises the top metal line 128C. The top metal line 128C comprises a turn T22', a terminal part T2C', and a connection part T23'. The turn T22' is between and connected to the connection part T23' and the terminal part T2C'. The connection part T23' of the top metal line 128C may be overlapped with a portion Q21 of the turn T21 and connected to the turn T21 of the bonding pad 146L through the other vias 148.

Referring to FIG. 1B, the bonding of the device die 112 to the device die 4 may be achieved through hybrid bonding. The hybrid bonding is a direct boding technology which includes metal-to-metal bonding and dielectric-to-dielectric bonding (fusion bonding) simultaneously. For example, the bond pads 146 are bonded to the bond pads 46 through metal-to-metal direct bonding. In some embodiments, the metal-to-metal direct bonding is copper-to-copper direct bonding. The bond pads 146 may have sizes greater than, equal to, or smaller than, the sizes of the respective bond pads 46. Although one the device die 112 is illustrated, there may be a plurality of the device dies 112 bonding to the wafer 2, and gaps 53 are left between neighboring the device dies 112. Furthermore, the insulating layer 144 is bonded to a surface of the insulating layer 44 through dielectric-to-dielectric bonding, which may be fusion bonding, for example, with Si—O—Si bonds generated. To achieve the hybrid bonding, the device die 112 is first pre-bonded to the insulating layer 44 and the bond pads 46 by lightly pressing the device die 112 against the device die 4. An anneal is then performed to incur the inter-diffusion of the metals in the bond pads 46 and the corresponding overlying bond pads 146.

After the device die 112 is bonded to the device die 4, a bonding structure 50' is formed between the top metal layers 28' and 128'. The bonding structure 50' includes an insulating structure 44', a bond pad structure 46', the vias 48 and the vias 148. The insulating structure 44' includes the insulating layer 44 and 144 bonded together. The bond pad structure 46' includes the bond pads 46 and 146 bonded to each other and embedded in the insulating structure 44'. The vias 48 and 148 are embedded in the insulating structure 44' and may couple the bond pad structures 46' to the top metal layers 28' and/or 128'.

Figure 2B:
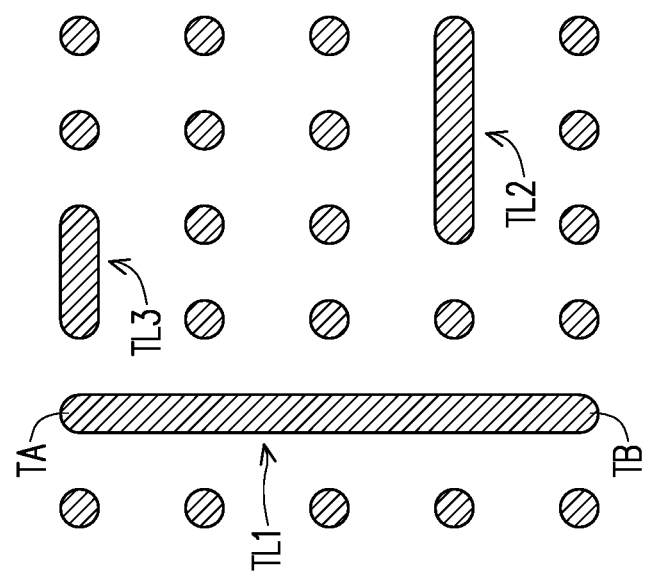
FIG. 2B illustrate a top view of components including transmission lines in accordance with some embodiments of the present disclosure.
Figure 3B:
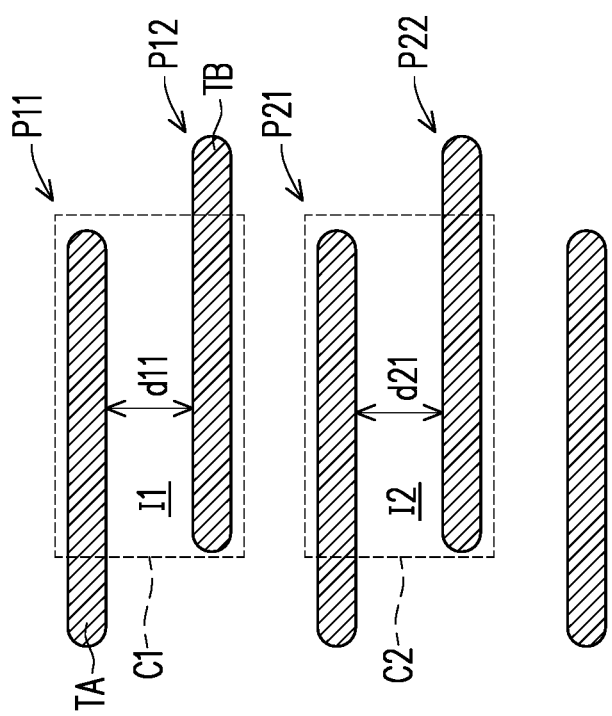
FIG. 3B illustrate a top view of components including capacitors in accordance with some embodiments of the present disclosure.

FIG. 1B illustrates a component F1 embedded in the bonding structure 50', which may be a transmission line or a passive device, which may also be a capacitor, an inductor, or the like, as illustrated in some embodiments in FIGS. 2B, 3B and 3C. The component F1 is formed simultaneously with the formation of the bonding structure 50'.

Figure 1C:
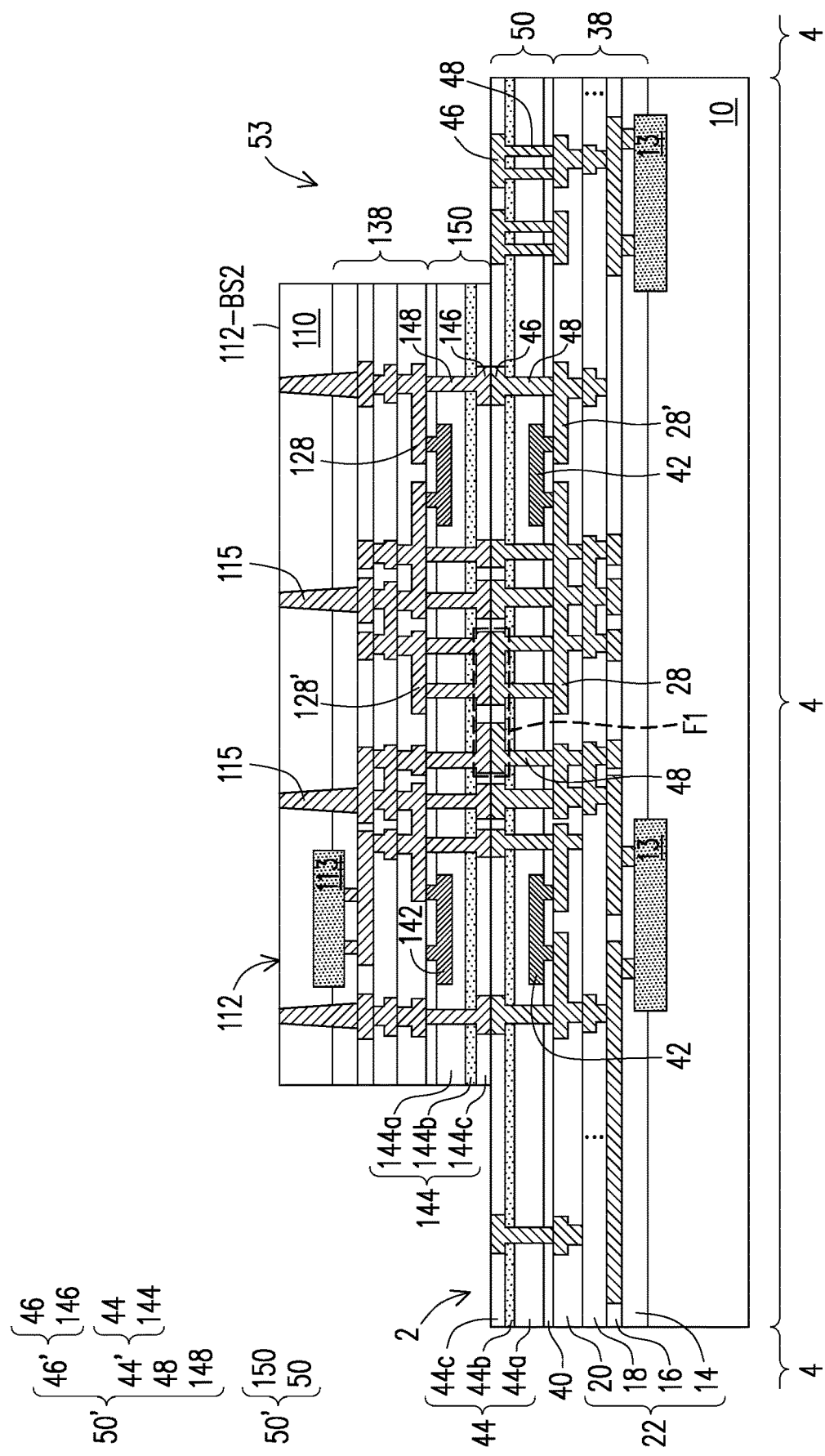
Figure 1D:
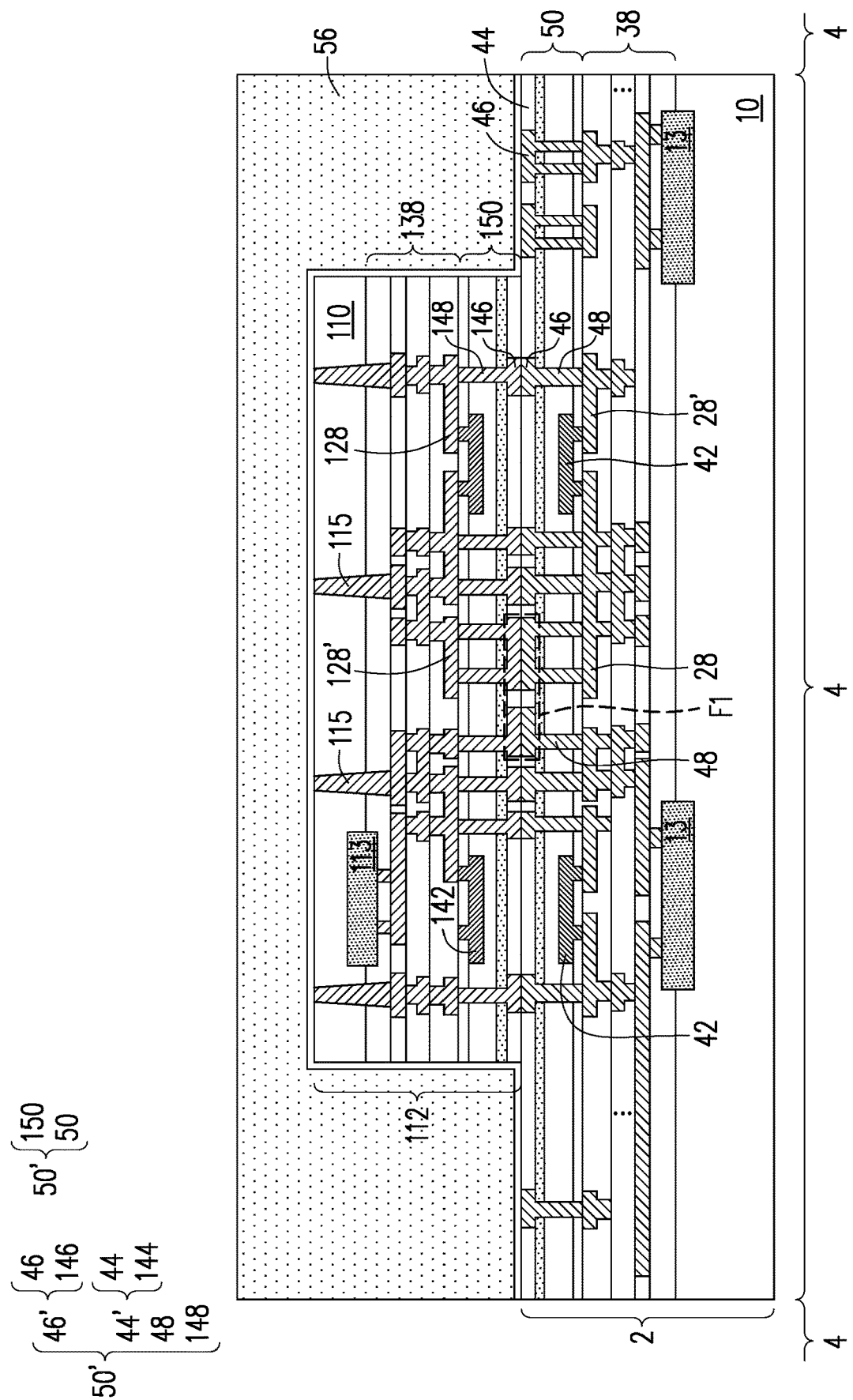
Figure 1E:
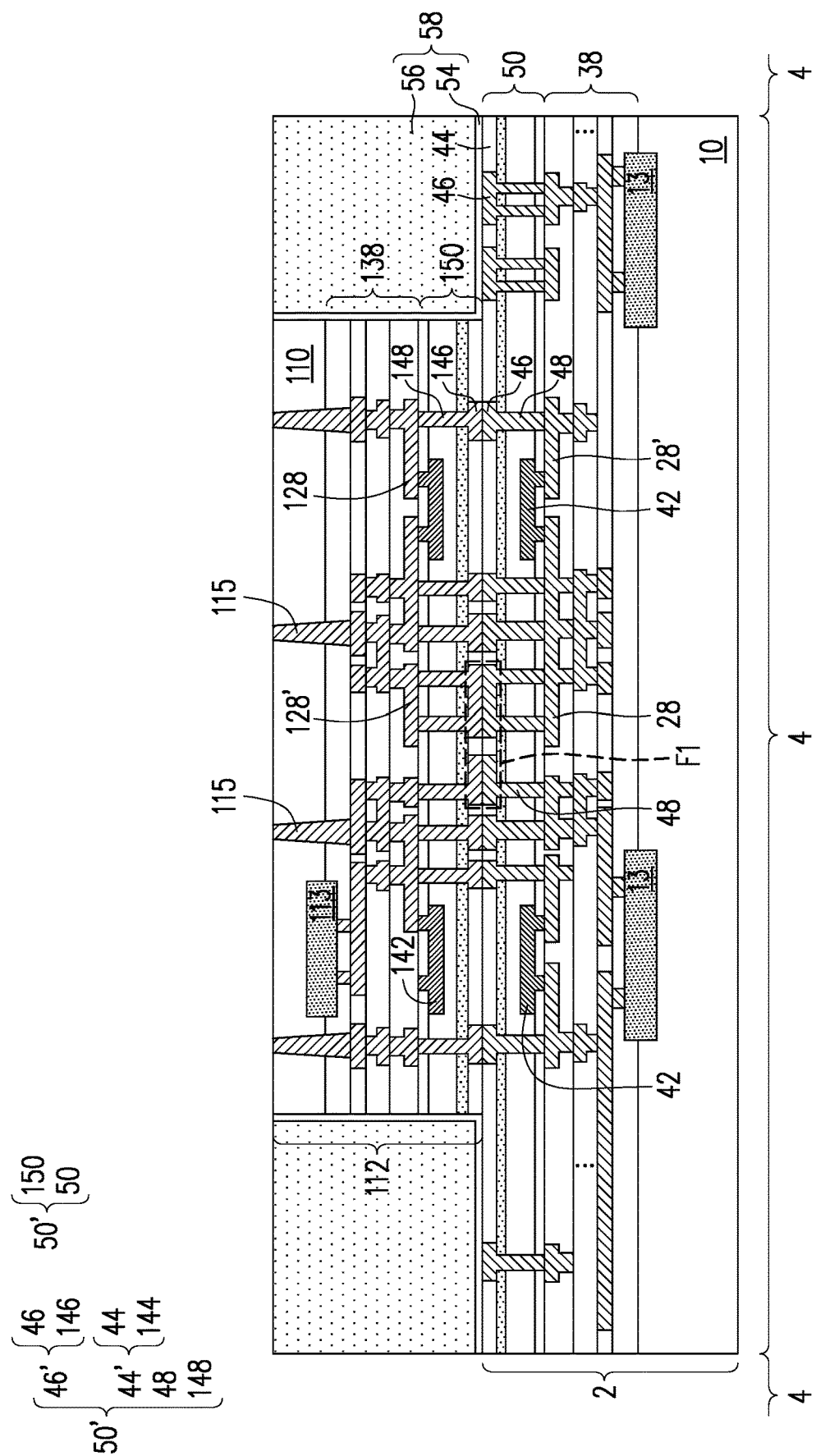
Figure 1F:
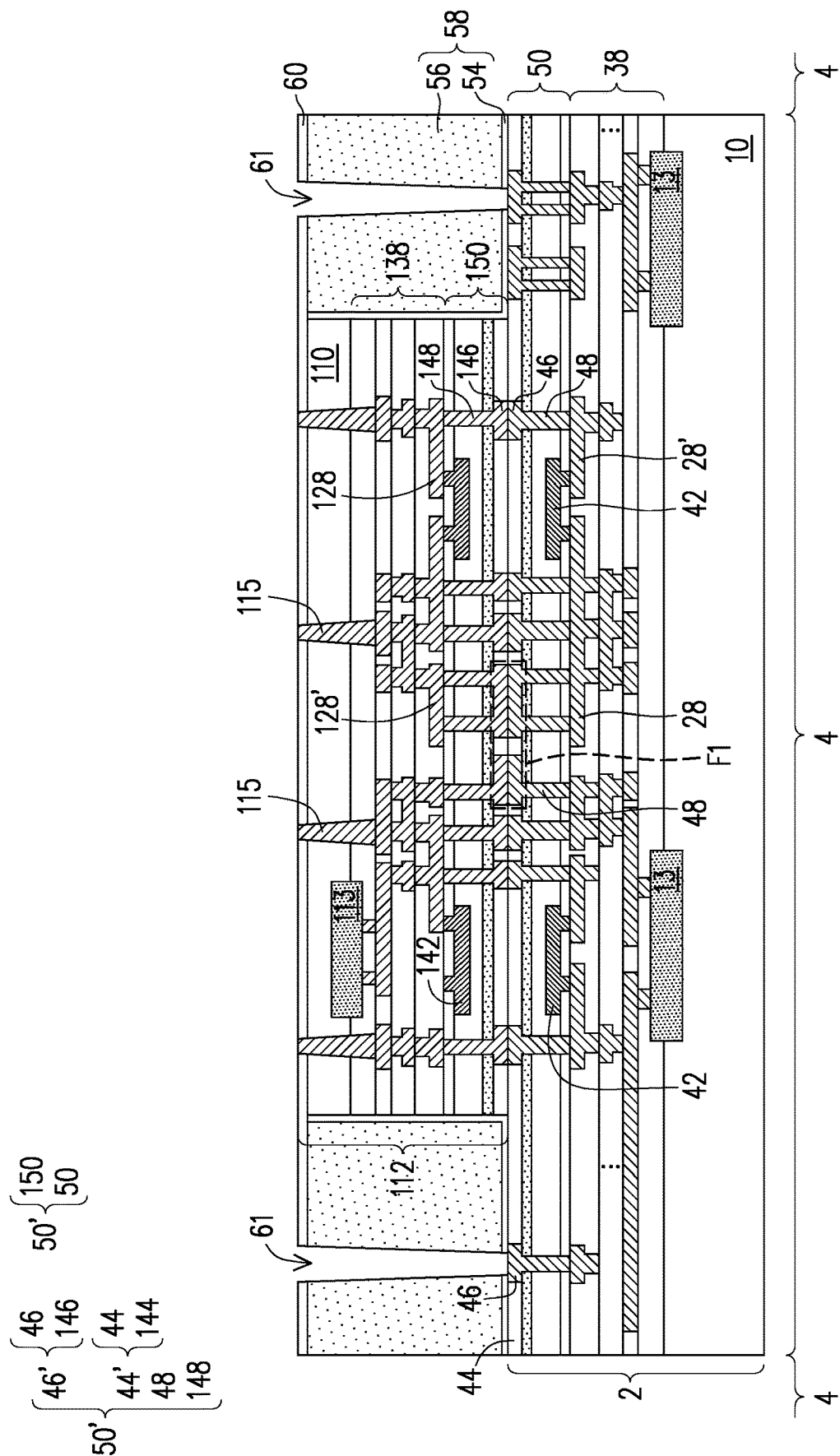
Figure 1G:
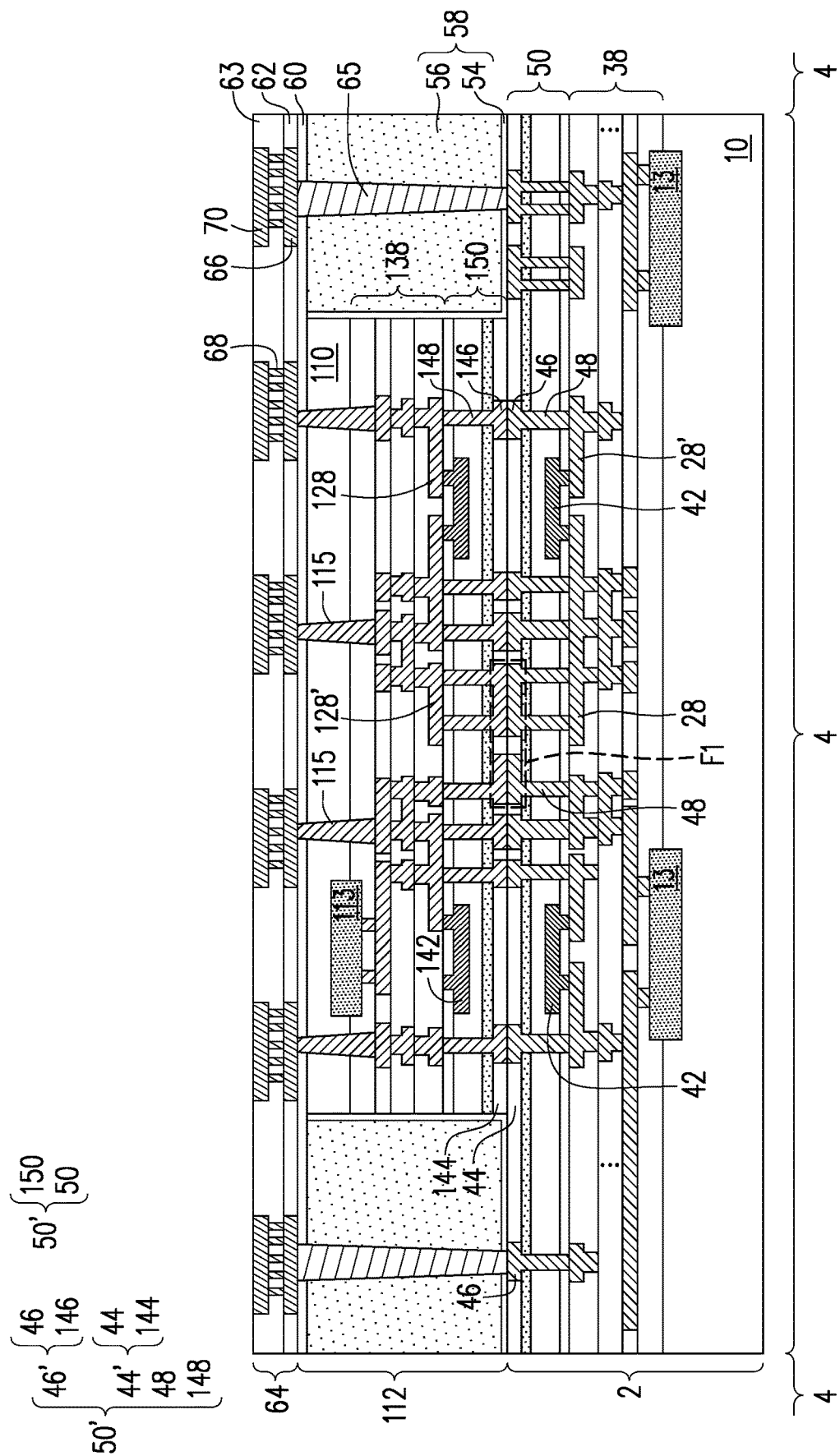
Figure 1H:
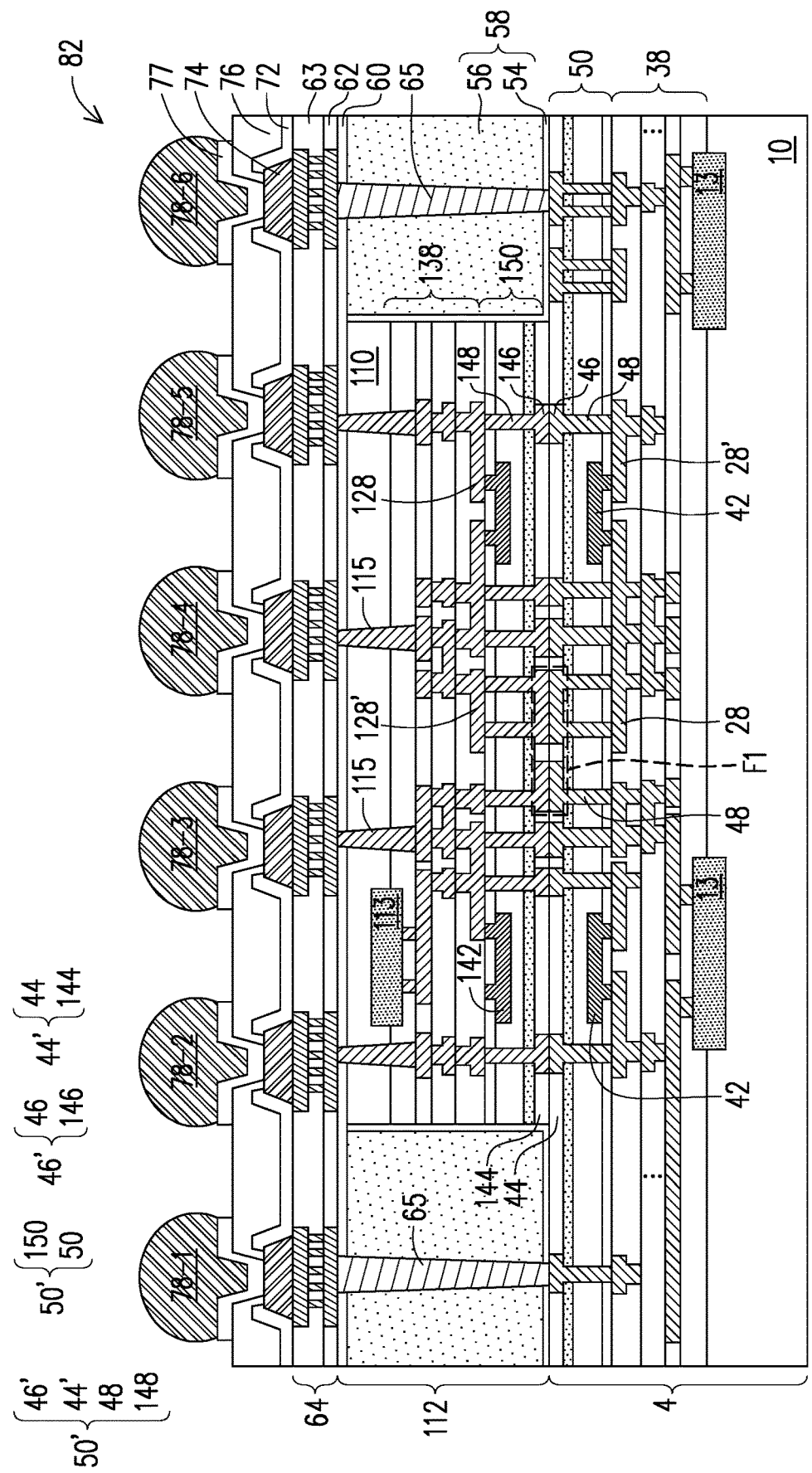

FIGS. 2B, 3B, 4B, 4D, 4E, and 4G illustrate top views of the components F1 which is formed form bonding structure or further combined with top metal layer illustrated in FIGS. 1B and 1H in accordance with some embodiments of the present disclosure.

FIG. 2B illustrate a top view of the components F1 including transmission lines TL1 to TL3 in accordance with some embodiments of the present disclosure.

Referring to FIGS. 2A and 2B, in accordance with some embodiments of the present disclosure, the device die 4 includes the bonding pad 46B, 46C, or 46D, and the device die 112 includes the bonding pad 146B, 146C, or 146D (FIG. 2A). After the bonding of the device die 112 and the device die 4, the bonding pad 146B, 146C, or 146D is bonded to the bonding pad 46B, 46C, or 46D to form a transmission line TL1, TL2, or TL3, respectively (FIG. 2B).

FIG. 3B illustrate a top view of the components F1 including capacitors C1 and C2 in accordance with some embodiments of the present disclosure.

Referring to FIGS. 3A and 3B, in accordance with alternative embodiments of the present disclosure, the device die 4 includes the bonding pads 46E and 46F, or 46G and 46H, and the device die 112 includes the bonding pads 146E and 146F, or 146G and 146H (FIG. 3A). The bonding pads 46E and 46 are respectively a portion of a first plate P11, and a portion of a second plate P12 of a first capacitor C1. The bonding pads 46G and 46H are respectively a portion of a first plate P21, and a portion of a second plate P22 of a second capacitor C2. The bonding pads 146E and 146F are respectively the other portion of the first plate P11, and the other portion of the second plate P12 of the first capacitor C1. The bonding pads 146G and 146H are respectively the other portion of the first plate P21, and the other portion of the second plate P22 of the second capacitor C2. After the bonding of the device die 112 and the device die 4, the bonding pads 146E and 146F bonded to the bonding pads 46E and 46F to form the first plate P11 and the second plate P12 of the entire first capacitor C1, respectively, and the bonding pads 146G and 146H bonded to the bonding pads 46G and 46H to form the first plate P21 and the second plate P22 of the entire second capacitor C2, respectively (FIG. 3B).

FIGS. 4B, 4D, 4E, and 4G illustrate top views of the components F1 including inductors L1 to L4 in accordance with some embodiments of the present disclosure.

Referring to FIGS. 4A and 4B, in accordance with other some embodiments of the present disclosure, the device die 4 includes the bonding pad 46J, and the device die 112 includes the bonding pad 146J. The bonding pad 46J is a bottom portion of an inductor, and the bonding pad 146J is upper portion of the inductor L1 (FIG. 4A). After the bonding of the device die 112 and the device die 4, the outer turn T11, the inner turn T12 and the connection part T13 of the bonding pad 46J is bonded to an outer turn T21, an inner turn T22 and a connection part T23 of the bonding pad 146J to form an outer turn T1, an inner turn T2 and a connection part T3 of the entire inductor L1 (FIGS. 4A and 4B).

Referring to FIGS. 4C and 4D, in accordance with alternative some embodiments of the present disclosure, the device die 4 includes the bonding pad 46K, and the bonding pad 46K is connected to the top meta lines 28A and 28B. The device die 112 includes the bonding pad 146K, and the bonding pad 146K is not connected to the top meta lines 128A and 128B. The bonding pad 146K is an upper portion of a first turn T1 of an inductor L2, and the bonding pad 46K is a bottom portion of the first turn T1 of the inductor L2. The turn T12' of the top meta lines 28A below the first turn T1 is a second turn T2 of the inductor L2, and connected to the first turn T1 through the vias 48. The terminal part T1A' of the top meta lines 28A is a first terminal TA of the inductor L2, and the terminal part T1B' of the top metal line 28B is a second terminal TB of the inductor L2. The first terminal TA and second terminal TB may be referred to as first end and second end, respectively.

Referring to FIGS. 4C and 4E, in accordance with alternative some embodiments of the present disclosure, the device die 4 includes the bonding pad 46K, and the bonding pad 46K is not connected to the top meta lines 28A and 28B. The device die 112 includes the bonding pad 146K, and the bonding pad 146K is connected to the top meta lines 128A and 128B. The bonding pad 146K is an upper portion of a first turn T1 of an inductor L3, and the bonding pad 46K is a bottom portion of the first turn T1 of the inductor L3. The turn T22' of the top meta lines 128A over the first turn T1 is a second turn T2 of the inductor L3, and connected to the first turn T1 through the vias 148. The terminal part T2A' of the top meta lines 128A is a first terminal TA of the inductor L3, and the terminal part T2B' of the top metal line 128B is a second terminal TB of the inductor L3.

Figure 4G:
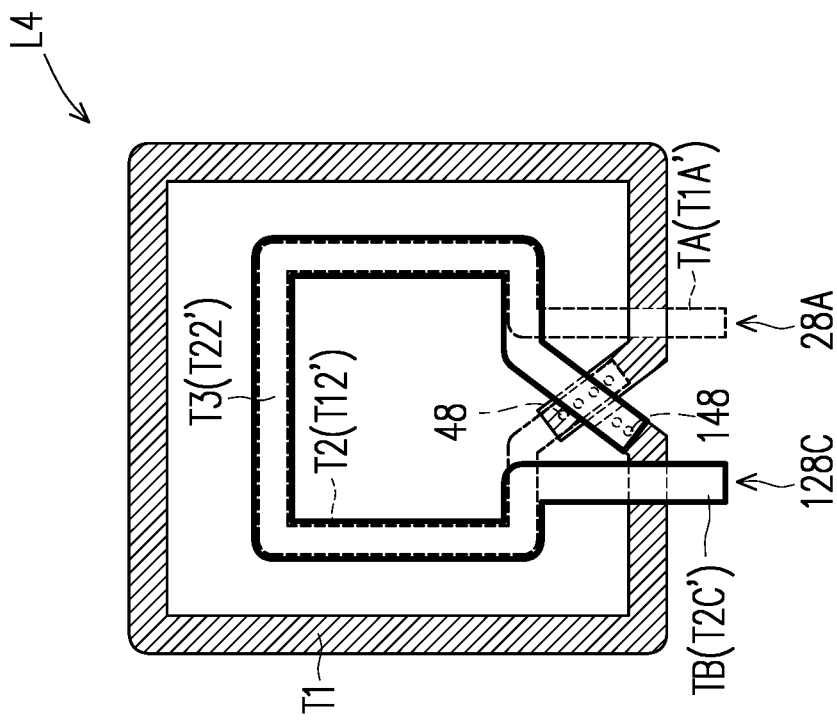

Referring to FIGS. 4F and 4G, in accordance with other some embodiments of the present disclosure, the inductor L4 comprises a first turn T1, a second turn T2, and a third turn T3. The first turn T1 is between the second turn T2 and the third turn T3. The device die 4 includes the bonding pad 46L, and the bonding pad 46L is connected to the top meta line 28A. The device die 112 includes the bonding pad 146L, and the bonding pad 146L is connected to the top meta line 128C. The bonding pad 146L is an upper portion of the first turn T1 of the inductor L4, and the bonding pad 46K is a bottom portion of the first turn T1 of the inductor L4. The turn T12' of the top meta lines 28A is the second turn T2 below the first turn T1 of the inductor L3, and connected to the first turn T1 through the vias 48. The turn T22' of the top meta lines 128C is the third turn T3 over the first turn T1 of the inductor L4, and is connected to the first turn T1 through the vias 148. The terminal part T1A' of the top meta lines 28A is a first terminal TA of the inductor L4, and the terminal part T2C' of the top metal line 128C is a second terminal TB of the inductor L4.

Referring to FIGS. 1B and 1C, in accordance with some embodiments, after the bonding process, a backside grinding may be performed to thin the device dies 112. After backside grinding, the conductive vias 115 penetrate through the substrate 110, and hence the conductive vias 115 may be referred to as through-silicon vias (TSVs), through-semiconductor vias or through-vias (TVs). Back surfaces 112-BS1, and 112-BS2 which are the back surface of the device die 112 before and after the backside grinding, respectively. Through the thinning of the device die 112, the aspect ratio of gaps 53 is reduced in order to perform gap filling. Otherwise, the gap filling may be difficult due to the otherwise high aspect ratio of gaps 53. After the backside grinding, the TSVs 115 may be revealed. Alternatively, the TSVs 115 are not revealed at this time, and the backside grinding is stopped when there is a thin layer of the substrate 110 covering the TSVs 115. In accordance with these embodiments, the TSVs 115 may be revealed in the step shown in FIG. 1E. In accordance with other embodiments in which the aspect ratio of gaps 53 is not too high for gap filling, the backside grinding is skipped.

FIG. 1D also illustrates the formation of gap-filling layers, which includes dielectric layer 56 and the underlying etch stop layer 54. The dielectric layer 56 may be deposited using a conformal deposition method such as atomic layer deposition (ALD) or chemical vapor deposition (CVD). The etch stop layer 54 is formed of a dielectric material that has a good adhesion to the sidewalls of the device dies 112, the top surfaces of the insulating layer 44, and the bond pads 46. In some embodiments, the etch stop layer 54 is formed of a nitride-containing material such as silicon nitride.

The dielectric layer 56 is formed of a material different from the material of the etch stop layer 54. In some embodiments, the dielectric layer 56 is formed of silicon oxide, which may be formed of TEOS, while other dielectric materials such as silicon carbide, silicon oxynitride, silicon oxy-carbo-nitride, PSG, BSG, BPSG, or the like may also be used. The dielectric layer 56 may be formed using CVD, high-density plasma chemical vapor deposition (HDPCVD), flowable CVD, spin-on coating, or the like. The dielectric layer 56 fully fills the remaining gaps 53 (FIG. 1C).

Referring to FIG. 1E, a planarization process such as a CMP process or a mechanical grinding process is performed to remove excess portions of the etch stop layer 54 and the dielectric layer 56, so that the device die 112 is exposed. Also, through-vias 115 are exposed. The remaining portions of the etch stop layer 54 and the dielectric layer 56 are collectively referred to as (gap-filling) isolation regions 58.

In some embodiments, as shown in FIG. 1F, the substrate 110 is lightly etched, so that through-vias 115 has a top portion protruding out of the top surfaces of the substrate 110. A dielectric layer 60 is formed, and is lightly polished to remove the portions of the dielectric layer 60 covering the through-vias 115. The dielectric layer 60 may be formed of silicon oxide, silicon nitride, silicon oxynitride, or the like. In some embodiments, the etching of the through-vias 115 and the formation of the dielectric layer 60 are skipped.

Referring to FIG. 1F, the dielectric layers 60, 56, and the etch stop layer 54 are etched to form openings 61. In some embodiments, a photoresist (not shown) is formed and patterned, and the dielectric layers 60 and 56 are etched using the patterned photoresist as an etching mask. The openings 61 are thus formed, and extend down to the etch stop layer 54, which acts as the etch stop layer. In some embodiments, the dielectric layers 60 and 56 comprise an oxide, and the etching may be performed through dry etching. The etching gas may include a mixture of $NF_3$ and $NH_3$, or a mixture of HF and $NH_3$. Next, the etch stop layer 54 is etched, so that the openings 61 extend down to the bond pads 46. In some embodiments, the etch stop layer 54 is formed of silicon nitride, and the etching is performed using dry etching. The etching gas may include a mixture of $CF_4$, $O_2$, and $N_2$, a mixture of $NF_3$ and $O_2$, $SF_6$, a mixture of $SF_6$ and $O_2$, or the like.

FIG. 1G illustrates the formation of through-dielectric vias (TDVs) 65. The TDVs 65 fill the openings 61 (FIG. 1F). The TDVs 65 are connected to bond pads 46. The TDVs 65 are electrically coupled to the integrated circuit devices 13. In some embodiments, the formation of the TDVs 65 includes performing a plating process such as an electrical-chemical plating process or an electro-less plating process. The TDVs 65 may include a metallic material such as tungsten, aluminum, copper, or the like. A conductive barrier layer (such as titanium, titanium nitride, tantalum, tantalum nitride, or the like) may also be formed underlying the metallic material. A planarization such as a CMP is performed to remove excess portions of the plated metallic material, and the remaining portions of the metallic material form the TDVs 65. The TDVs 65 may have substantially straight and vertical sidewalls. Also, the TDVs 65 may have a tapered profile, with top widths slightly greater than the respective bottom widths.

In accordance with alternative embodiments, the TSVs 115 are not pre-formed in the device dies 112. Rather, they are formed after the formation of isolation regions 58. For example, either before or after the formation of the openings 61 (FIG. 1F), the device dies 112 are etched to form additional openings (occupied by the illustrated the TSVs 115). The additional openings in the device dies 112 and the openings 61 may be filled simultaneously to form through the TSVs 115 and the TDVs 65. The resulting through-vias 115 may have upper portions wider than the respective lower portions, opposite to what are shown in FIG. 1G.

Referring to FIG. 1G, a redistribution line (RDL) structure 64 is formed. In some embodiments, the RDL structure 64 comprises dielectric layers 62 and 63, redistribution lines (RDLs) 66 and 70, and vias 68. In some embodiments, the dielectric layers 62 and 63 are formed of an oxide such as silicon oxide, a nitride such as silicon nitride, or the like. Although two RDL layers are illustrated, the RDL structure 64 may include more than two layers of RDLs. The RDLs 70 and the vias 68 may be formed using single and/or dual damascene processes, which include etching the dielectric layers to form via openings and trenches, depositing a conductive barrier layer into the openings, plating a metallic material such as copper or a copper alloy, and performing a planarization to remove the excess portions of the metallic material. There may be etch stop layers between the dielectric layers 60, 62, and 63, which etch stop layers are not shown.

Referring to FIG. 1H, a passivation layer 72 and a metal pads 74 are formed. The passivation layer 72 is formed over the dielectric layer 63. The metal pads 74 are formed over the passivation layer 72, and are electrically coupled to the RDLs 70. The metal pads 74 may be aluminum pads or aluminum-copper pads, and other metallic materials may be used. In some embodiments, the metal pads 74 are not formed, and Post-Passivation Interconnects (PPIs) are formed. The passivation layer 72 may be a single layer or a composite layer, and may be formed of a non-porous material. In some embodiments, the passivation layer 72 is a composite layer including a silicon oxide layer (not shown separately), and a silicon nitride layer (not shown separately) over the silicon oxide layer. The passivation layer 72 may also be formed of other non-porous dielectric materials such as undoped silicate glass (USG), silicon oxynitride, silicon nitride, and/or the like. Next, polymer layer 76 is formed, and then patterned to expose the metal pads 74. The polymer layer 76 may be formed of polyimide, polybenzoxazole (PBO), benzocyclobutene (BCB) polymer, polyimide (PI) or the like and is formed by a suitable process such as spin coating, CVD or the like.

Referring to FIG. 1H, Under-bump metallurgies (UBMs) 77 are formed, and the UBMs 77 extend into the polymer layer 76 to connect to metal pads 74 or PPIs. In some embodiments, each of the UBMs 77 includes a barrier layer (not shown) and a seed layer (not shown) over the barrier layer. The barrier layer may be a titanium layer, a titanium nitride layer, a tantalum layer, a tantalum nitride layer, or a layer formed of a titanium alloy or a tantalum alloy. The materials of the seed layer may include copper or a copper alloy. Other metals such as silver, gold, aluminum, palladium, nickel, nickel alloys, tungsten alloys, chromium, chromium alloys, and combinations thereof may also be included in the UBMs 77. However, one of ordinary skill in the art will recognize that there are many suitable arrangements of materials and layers, such as an arrangement of chrome/chrome-copper alloy/copper/gold, an arrangement of titanium/titanium tungsten/copper, or an arrangement of copper/nickel/gold, that are suitable for the formation of the UBMs 77. Any suitable materials or layers of material that may be used for the UBMs 77 are fully intended to be included within the scope of the current application.

As also shown in FIG. 1H, electrical connectors 78 (including 78-1 through 78-6) are formed. An exemplary formation process for forming the UBMs 77 and the electrical connectors 78 includes depositing a blanket UBM layer, forming and patterning a mask (which may be a photo resist, not shown), with portions of the blanket UBM layer being exposed through the openings in the mask. After the formation of the UBMs 77, the illustrated package is placed into a plating solution (not shown), and a plating step is performed to form the electrical connectors 78 on the UBMs 77. In accordance with some exemplary embodiments of the present disclosure, the electrical connectors 78 include non-solder parts (not shown), which are not molten in the subsequent reflow processes. The non-solder parts may be formed of copper, and hence are referred to as copper bumps hereinafter, although they may be formed of other non-solder materials. Each of the electrical connectors 78 may also include cap layer(s) (not shown) selected from a nickel layer, a nickel alloy, a palladium layer, a gold layer, a silver layer, or multi-layers thereof. The cap layer(s) are formed over the copper bumps. The electrical connectors 78 may further include solder caps. The structure formed in preceding steps is referred to as composite wafer. A die-saw (singulation) step is performed on composite wafer to separate composite wafer into a plurality of packages 82. In some embodiments, the singulation process may comprise sawing, laser ablation, etching, a combination thereof, or the like.

As shown in FIGS. 1H, 2B, 3B and 4B, the component F1 (such as the transmission line TL1, the capacitor C1, or the inductor L1) includes two terminals (such as TA and TB), the two terminals may be electrically connected to electrical connectors 78-3 and 78-4 through the vias 148, the interconnect structure 138, the TSVs 115 and the RDL structure 64 respectively in accordance with some embodiments.

In some embodiments, as shown in FIG. 1H, the component F1 is formed in package 82, and may be, or may not be, electrically connected to and used by, the integrated circuits inside package 82. The two terminals of the component F1 are connected outside of package 82. Accordingly, when the component F1 is a passive device, and the component F1 may have the same function as surface-mount device (SMD), also known as integrated passive device (IPD). When the package 82 is packaged with other package components to form bigger packages such as a package-on-package (PoP), the other package components may access and use the component F1 directly through electrical connectors (such as solder regions) and TSVs.

Referring to FIG. 1B through FIG. 1H, the component F1 included in the package 82 is formed simultaneously with the formation of the bond pad structure 46' of the bonding structure 50'. The bonding structure 50' is formed between the top metal layers 28' and 128' in an normal direction of the substrate 110 or 10. FIGS. 5 and 6 illustrates packages 82A and 82B including component F1A in bonding structure 50A' of the device die 4A and device die 112A, and component F1B and in bonding structure 50B' of the device dies 4B and device dies 112B, respectively. The components F1A and F1B are formed simultaneously with the formation of bond pad structures 47A' and 47B' of the bonding structures 50A' and 50B', respectively, in which the structures 47' and 47B' are formed between metal pads 42 and 142 in the normal direction of the substrate 110 or 10.

FIG. 5 illustrates the package 82A including the device die 112A and a device die 4A. The device die 112A is boned to the device die 4A through the bonding structure 50A' thereof. The device die 4A and the device die 112A are similar to device die 4 and the device die 112, respectively, and the difference is that a bonding layer 50A of the device die 4A and a bonding layer 150A of the device die 112A are different from the bonding layer 50 of the device die 4 and the bonding layer 150 of the device die 112 respectively. The bonding layer 50A of the device die 4A includes an insulating layer 44, bond pads 47A, and vias 48A. The bond pads 47A and the vias 48A are embedded in the insulating layer 44. The bond pads 47A is formed on and in contact with the vias 48A. The shapes and sizes of the vias 48A may be similar to the shapes and sizes of the vias 48, while the vias 48A are landed on the metal pad 42, which may be electrically coupled to a top metal line 28. The bonding layer 150A of the device die 112A includes an insulating layer 144, bond pads 147A, and vias 148A. The bond pads 147A and the vias 148A are embedded in the insulating layer 144. The bond pads 147A is formed on and in contact with the vias 148A. The shapes and sizes of the vias 148A may be similar to the shapes and sizes of the vias 148, while the vias 148A are landed on the metal pad 142, which may be electrically coupled to a top metal line 128. The bonding layer 50A of the device die 4A is boned to a bonding layer 150A of the device die 112A through a hybrid bonding.

In some embodiments, the bond pads 47A and vias 48A or/and the bond pads 147A and vias 148A may formed through dual damascene process, respectively. In a dual damascene process, a trench and a via opening are first formed in the insulating layer, thereby exposing the metal pad, followed by filling the trench and the via with a conductive material. A planarization process such as a CMP process is then performed to remove the excess portions of the conductive material higher than the top surface of the insulating layer, leaving a bond pad in the trench and a via in the via opening.

After the device die 112A is bonded to the device die 4A through hybrid bonding, the bonding structure 50A' is formed. The bonding structure 50A' includes an insulating structure 44A', and a bond pad structure 47A'. The insulating structure 44A' includes the insulating layers 44 and 144 bonded together. The bond pad structure 47A' includes the bond pads 47A and 147A bonded to each other. The bond pad structure 47A' is embedded in the insulating structure 44A', and connected to the metal pads 42 and/or the metal pads 142 through the vias 48A and/or 148A.

FIG. 6 illustrates a package 82B including a device die 112B and a device die 4B. The device die 4B and the device die 112B are similar to device die 4 and the device die 112, respectively, and the difference is that a bonding layer 50B of the device die 4B and a bonding layer 150B of the device die 112B are different from the bonding layer 50 of the device die 4 and the bonding layer 150 of the device die 112, respectively.

The device die 112B is boned to the device die 4B through a bonding structure 50B' thereof. The bonding layer 50B of the device die 4B is boned to the bonding layer 150B of the device die 112B through a hybrid bonding, thereby forming the bonding structure 50B'. The bonding layer 50B and 150B are similar to the bonding layer 50A and 150A, respectively. The difference is that the bonding layer 50B and 150B include bond pads 47B and 147B, and the bond pads 47B and 147B are in physical contact with metal pads 42 and 142, and are fee from vias 48 and 148 therebetween, respectively.

In some embodiments, the bond pads 47B, 47B or/and 147B, 147B may formed through single damascene process. In a single damascene process, a trench is first formed in the insulating layer, thereby exposing the metal pad, followed by filling the trench with a conductive material. A planarization process such as a CMP process is then performed to remove the excess portions of the conductive material higher than the top surface of the insulating layer, leaving a bond pad in the trench.

After the device die 112B is bonded to the device die 4B through hybrid bonding, the bonding structure 50B' is formed. The bonding structure 50B' includes an insulating structure 44B', and a bond pad structure 47B'. The insulating structure 44B' includes the insulating layers 44 and 144 bonded together. The bond pad structure 47B' includes the bond pads 47B and 147B bonded to each other. The bond pad structure 47B' is embedded in the insulating structure 44B' and in physical contact with the metal pads 42 and/or the metal pads 142.

In FIGS. 5 and 6, the components F1A and F1B are formed simultaneously with the formation of the bonding structures 50A' and 50B', respectively. The components F1A and F1B may be a transmission line TL1, TL2, or TL3, or a passive device, which may also be a capacitor C1 or C2, an inductor L1, L2, L3 or L4, or the like, as illustrated in some embodiments in FIG. 2B, 3B, 4B, 4D, 4E, or 4G, respectively. The components F1A and F1B are similar to the component F1 as shown in FIG. 1H. The difference is that the component F1 is separated from the metal pads 42 and 142 through the insulating layers 44 and 144, while the components F1A and F1B are electrically connected to the metal pad 142 and the metal pad 42. The components F1A is electrically connected to the metal pad 42 and the metal pad 142 through vias 48A and vias 148A directly landing on the metal pad 42 and the metal pad 142, respectively. The component F1B is in physical contact with the metal pad 42 and the metal pad 142.

Referring to FIGS. 1H, 5, 6, and 2B, in accordance with some embodiments, the components F1, F1A and F1B are a transmission line (such as, for example, the transmission line TL1), respectively. The component F1 is in physical contact with one or more vias 148, and/or in contact with one or more vias 48 in accordance with some embodiments. The one or more vias 148 and the one or more vias 48 may be coupled to the top metal lines 128 and 28, respectively, or not. The component F1A is in contact with one or more vias 148A, and/or in physical contact with one or more vias 48A in accordance with some embodiments. The one or more vias 148A, and the one or more vias 48A may be coupled to the metal pads 142 and 42, respectively, or not. The component F1B is in contact with one or more metal pads 142, and/or in physical contact with one or more metal pads 42 in accordance with other some embodiments. The one or more metal pads 142, and the one or more metal pads 42 may be coupled to the metal lines 126 and 26, respectively, or not.

Referring to FIGS. 1H, 5, 6, and 3B, in accordance with alternative embodiments, the components F1, F1A and F1B are a capacitor (such as, for example capacitor C1 or C2 illustrated in FIG. 3B), respectively. The capacitor C1 includes the plate P11, the plate P12, and an insulating film I1. The capacitor C2 includes the plate P21, the plate P22, and an insulating film I2. The plates P11, P12, P21, and P22 are disposed on the same level, and separated from each other. The insulating film I1 is disposed between the plates P11 and P12, and insulating film I2 is disposed between the plates P21 and P22. The plates P11, P12, P21, and P22 are a portion of the bonding pad structure (such as, for example, the bonding pad structure 46', 47A' or 47B' illustrated in FIG. 1H, 5, or 6), respectively. The insulating films I1 and I2 are a portion of the insulating structure (such as, for example, the insulating structure 44', 44A' or 44B' illustrated in FIG. 1H, 5, or 6), respectively. The insulating film I1 has a width d11, and the insulating film I2 has a width d21. The width d11 may be equal to or different from the width d21. The widths d11 and d21 ranges, for example, from 100 nm to 10,000 nm.

In accordance with some embodiments in which the capacitors C1 and C2 are formed from the component F1, each of the plates P11, P12, P21, and P22 is in physical contact with one or more vias 148, and/or in contact with one or more vias 48. The one or more vias 148, and the one or more vias 48 may be coupled to the top metal lines 128 and 28, respectively, or not.

In accordance with some embodiments in which the capacitors C1 and C2 is formed from the component F1A, each of the plates P11, P12, P21, and P22 is in contact with one or more vias 148A, and/or in physical contact with one or more vias 48A in accordance with some embodiments. The one or more vias 148A, and the one or more vias 48A may be coupled to the metal pads 142 and 42, respectively, or not.

In accordance with some embodiments in which the capacitors C1 and C2 is formed from the component F1B, each of the plates P11, P12, P21, and P22 is in contact with one or more metal pads 142, and/or in physical contact with one or more metal pads 42 in accordance with other some embodiments. The one or more metal pads 142, and the one or more metal pads 42 may be coupled to the top metal layers 128' and 28', respectively, or not.

Referring to FIGS. 1H, 5, 6, and 4B, in accordance with other some embodiments, the components F1, F1A and F1B are an inductor L1, respectively. The inductor L1 includes a plurality of turns and a plurality of connection parts. In some embodiments, the inductor L1 comprises an outer turn T1, an inner turn T2 and a connection part T3. The outer turn T1, the inner turn T2 and the connection part T3 are coplanar. The outer turn T1 and the inner turn T2 are electrically connected through the connection part T3. The outer turn T1 and the inner turn T2 may have the same or similar shape. The outer turn T1 has a terminal TA, and the inner turn T2 has a terminal TB. The outer turn T1, the inner turn T2 and the connection part T3 may be a portion of the bonding pad structure such as 46', 47A' or 47B' shown in FIG. 1H, 5, or 6), respectively.

Referring to FIGS. 4B and 1H, in accordance with some embodiments in which inductor L1 is formed from the component F1, the terminal TA and the terminal TB are in physical contact with one or more vias 148, and/or in contact with one or more vias 48, respectively. The one or more vias 148, and the one or more vias 48 may be coupled to the top metal lines 128 and 28, respectively, or not.

Referring to FIGS. 4B and 5, in accordance with alternative embodiments in which inductor L1 is formed from the component F1A, the terminal TA and the terminal TB are in physical contact with one or more vias 148A, and/or in physical contact with one or more vias 48A. The one or more vias 148A, and the one or more vias 48A may be coupled to the metal pads 142 and 42, respectively, or not.

Referring to FIGS. 4B and 6, in accordance with other some embodiments in which inductor L1 is formed from the component F1B, the terminal TA and the terminal TB are in physical contact with one or more metal pads 142, and/or in physical contact with one or more metal pads 42, respectively. The one or more metal pads 142, and the one or more metal pads 42 may be coupled to the metal lines 128 and 28, respectively, or not.

It is appreciated that the transmission line, the capacitor or the inductor may have many different structures than what are shown in FIGS. 2B, 3B, 4B, 4D, 4E and 4G.

Figure 7A:
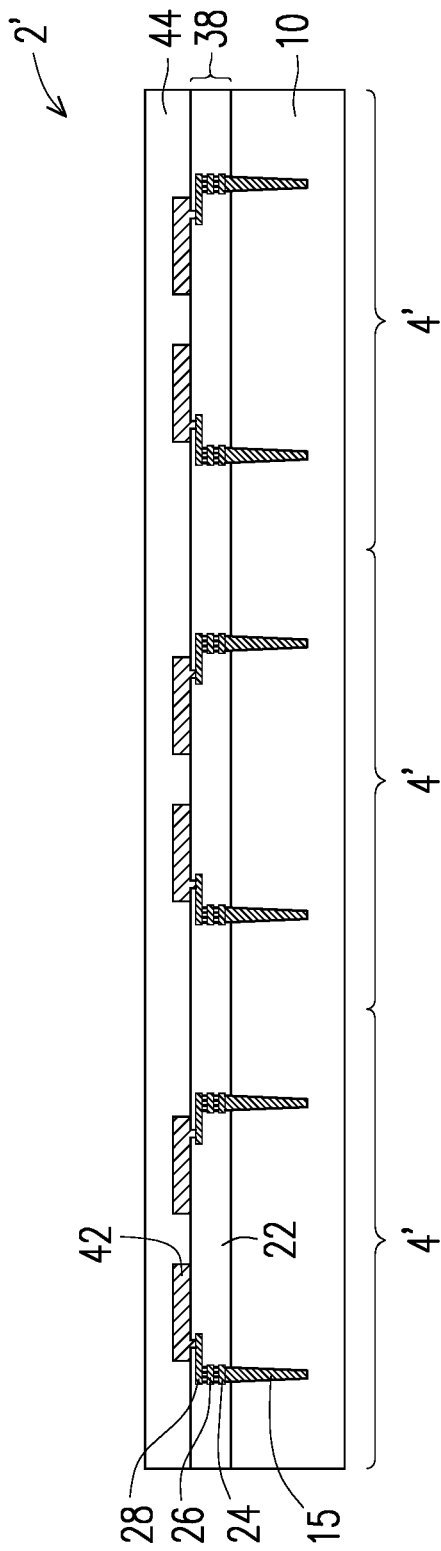
FIGS. 7A to 7B illustrate cross-sectional views of various processing steps during fabrication of device dies in accordance with some embodiments of the present disclosure.
Figure 7B:
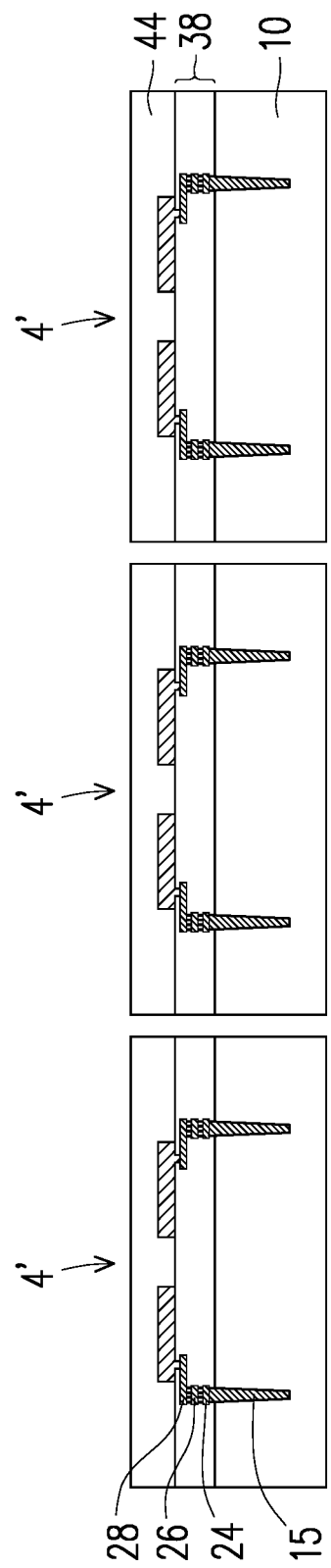

The package shown in FIG. 1H, 5, or 6 has a face-to-face structure, in which the device die 112, 112A or 112B have their front surfaces (or referred to as active surfaces) facing the front surface (or referred to as active surface) of the device die 4, 4A or 4B, respectively. FIGS. 8A to 8H, 9A to 9E, 10, and 11 are schematic cross-sectional views illustrating various stages in a manufacturing method of a face-to-back structure, in which the device die 112' (such as 112$_1$', 112$_2$', 112$_3$', 112$_4$'), or 112A' (such as 112A$_1$', 112A$_2$', 112A$_3$', 112A$_4$') have their front surfaces (or referred to as active surfaces) facing the back surface (or referred to as active surface) of device die 4', respectively, according to some embodiments of the disclosure. FIGS. 7A to 7B illustrate cross-sectional views of various processing steps during fabrication of the device dies 4' in accordance with some embodiments of the present disclosure.

FIG. 7A illustrates the cross-sectional view in the formation of a wafer 2'. The wafer 2' include a plurality of chips (or referred to as deice dies) 4' therein, with one of chips 4 illustrated. The device die 4' may be a logic die, a memory die, a radio frequency die, a power management die, a micro-electro-mechanical-system (MEMS) die, a system on chip (SoC), a CPU, a GPU, an Xpu, or the like. In accordance with some embodiments, the wafer 2' is similar to the wafer 2 illustrated in FIG. 1A, and device dies 4' may be similar to the device dies 4 and may be formed using a method described above with reference to FIG. 1A, with similar features of the device dies 4 and 4' being referred to with similar numerical references.

The difference between the wafer 2 and 2' is that the wafer 2' include conductive vias 15, and does not include the bonding pads 46 and the vias 48 in the insulating layer 44. The conductive vias 15 are formed in the substrate 10 and the ILD layer of the dielectric structure 22. The conductive vias 15 are used to connect the integrated circuit devices 13 and the metal lines 24 of the interconnect structure 38. In some embodiments, the conductive vias 15 is formed after the integrated circuit devices (not shown) are formed and before the metal lines 24 of the interconnect structure 38 is formed. The material and the formation of the conductive vias 15 may be similar to the TSVs 115, and hence the details are not repeated herein.

Referring to FIG. 7B, the wafer 2' is singulated to form individual device dies 4'. In some embodiments, the wafer 2' may be singulated into individual device dies 4', for example, by sawing, laser ablation, etching, a combination thereof, or the like.

FIGS. 8A to 8H illustrate cross-sectional views of various processing steps during fabrication of packages in accordance with some embodiments of the present disclosure.

Figure 8A:
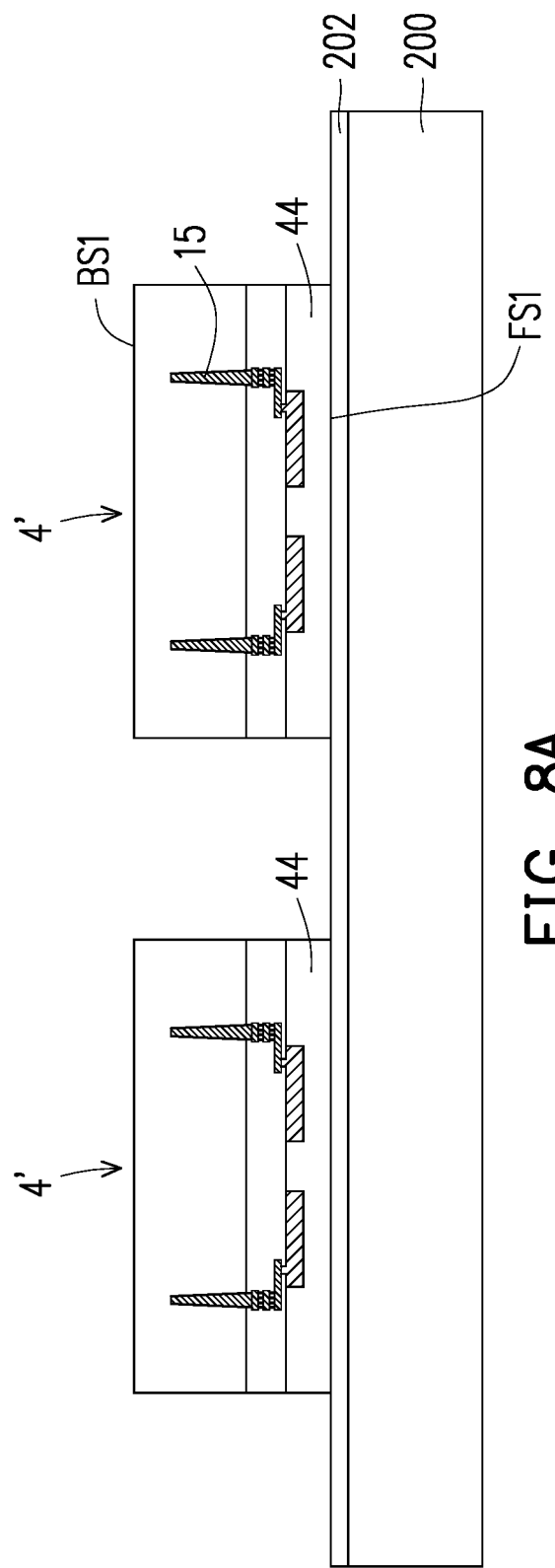
FIGS. 8A to 8H illustrate cross-sectional views of various processing steps during fabrication of packages in accordance with some embodiments of the present disclosure.

Referring to FIG. 8A, the device dies 4' are placed on a temporary carrier 200. In some embodiments, the device dies 4' are attached to the temporary carrier 200 by a temporary bonding layer 202. A material of the temporary carrier 200 may include glass, metal, ceramic, silicon, plastic, combinations thereof, multi-layers thereof, or other suitable material that may provide structural support for the device dies 4' in subsequent processing. In some embodiments, the temporary carrier 200 is made of glass, and the temporary bonding layer 202 includes an adhesive layer (e.g., die attach film (DAF)), a ultra-violet (UV) cured layer, such as a light-to-heat conversion (LTHC) release coating, ultra-violet (UV) glue, which reduces or loses its adhesiveness when exposed to a radiation source (e.g., UV light or a laser). Other suitable temporary adhesives may be used. In some embodiments, the front surface FS1 of the device dies 4' is attached to the temporary carrier 200 and the back surface BS1 of the device dies 4' faces upwardly for subsequent processing.

Figure 8B:
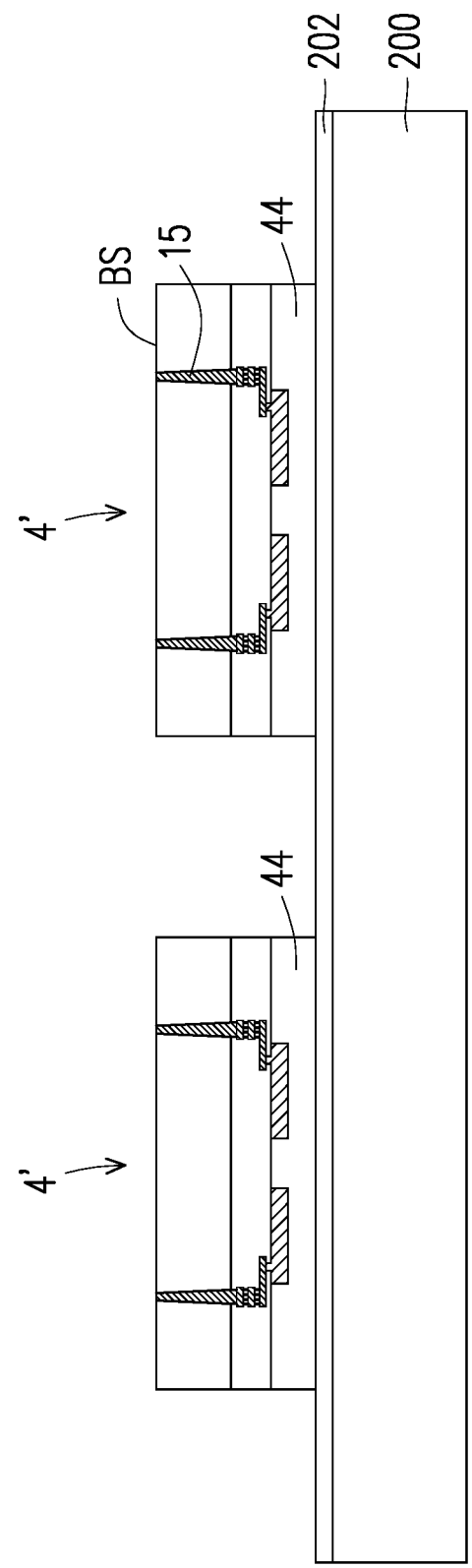

Referring to FIG. 8B, a backside grinding may be performed by, for example, grinding process, chemical mechanical polishing (CMP) process, etching processes, combinations thereof, or other suitable grinding techniques, so that the conductive vias 15 are accessibly revealed through the back surface of the substrate 10. Since the conductive vias 15 extend through the substrate 10, the conductive vias 15 may be referred to as through vias (TVs), through substrate vias (TSVs) or through silicon vias when the substrate 10 is a silicon substrate. The top surfaces of the TSVs 15 and the top surface of the substrate 10 may be substantially coplanar with each other, and together constitute the back surface BS of the device die 4'.

Figure 8C:
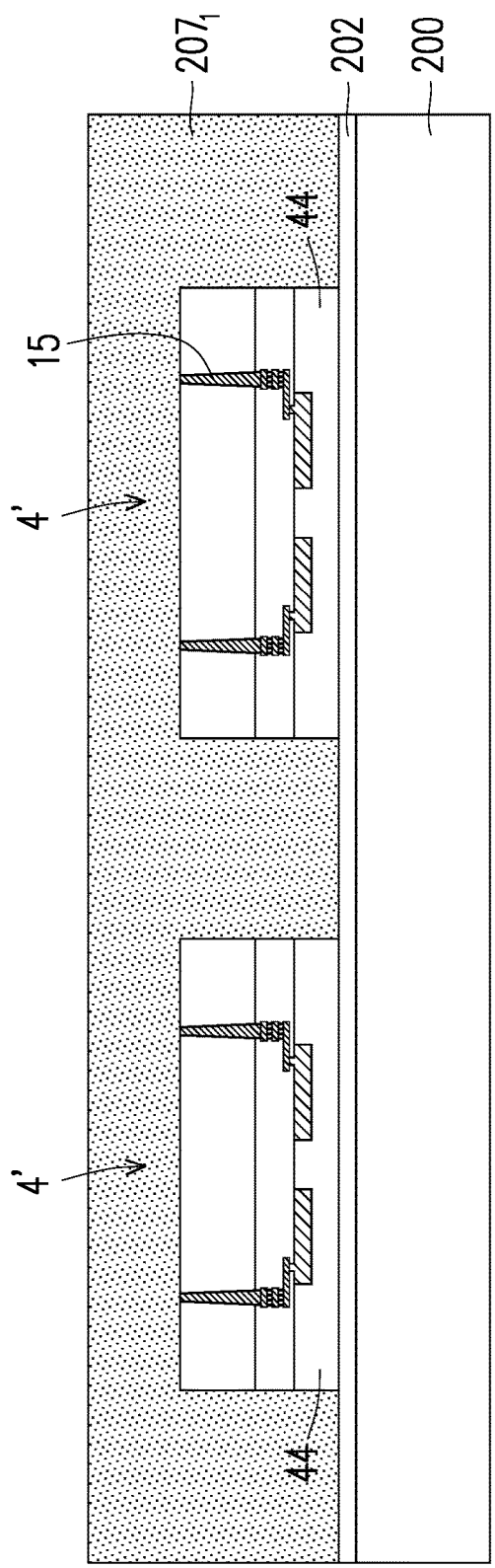

Referring to FIG. 8C, an encapsulant $207_1$ is formed over and surrounding the device dies 4'. The encapsulant $207_1$ may be referred to as a gap fill material. In some embodiments, the encapsulant $207_1$ may comprise one or more layers of non-photo-patternable insulating materials such as silicon nitride, silicon oxide, phosphosilicate glass (PSG), borosilicate glass (BSG), boron-doped phosphosilicate glass (BPSG), a combination thereof, or the like, and may be formed using CVD, PVD, ALD, a spin-on coating process, a combination thereof, or the like. In other embodiments, the encapsulant $207_1$ may comprise one or more layers of photo-patternable insulating materials such as polybenzoxazole (PBO), polyimide (PI), benzocyclobutene (BCB), a combination thereof, or the like, and may be formed using a spin-on coating process, or the like. Such photo-patternable insulating materials may be patterned using similar photolithography methods as a photoresist material. In other embodiments, the encapsulant $207_1$ may comprise a molding compound, such as an epoxy, a resin, a moldable polymer, a combination thereof, or the like. The molding compound may be applied while substantially liquid, and then may be cured through a chemical reaction, such as in an epoxy or resin. In other embodiments, the molding compound may be an ultraviolet (UV) or thermally cured polymer applied as a gel or malleable solid capable of being disposed around and between the device dies 4'.

Figure 8D:
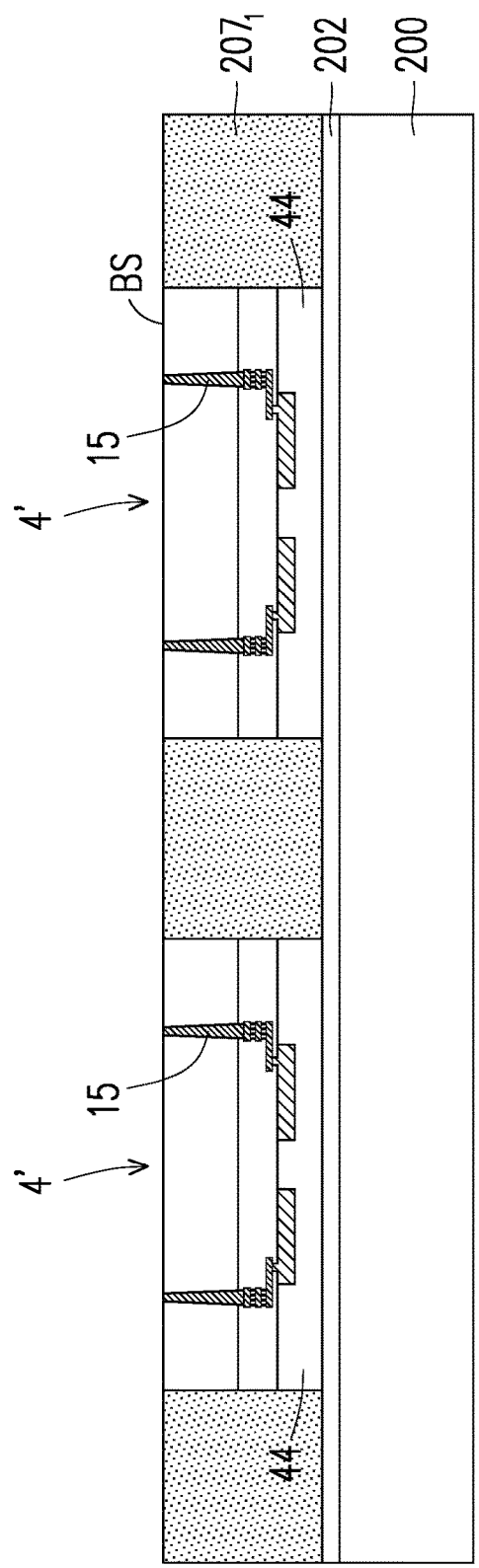

Referring to FIG. 8D, the encapsulant $207_1$ and the device dies 4' are planarized, such that backside surfaces of the device dies 4' are substantially level or coplanar with a topmost surface of the encapsulant $207_1$. In some embodiments the encapsulant $207_1$ and the device dies 4' may be planarized using a CMP process, a grinding process, an etching process, a combination thereof, or the like. In some embodiment, the planarization process exposes the TSVs 15, such that exposed surfaces of the TSVs 15 are substantially level or coplanar with the backside surfaces BS of the device dies 4' and the topmost surface of the encapsulant $207_1$. The device dies 4' and the encapsulant $207_1$ form a tier 1 structure $205_1$.

Figure 8E:
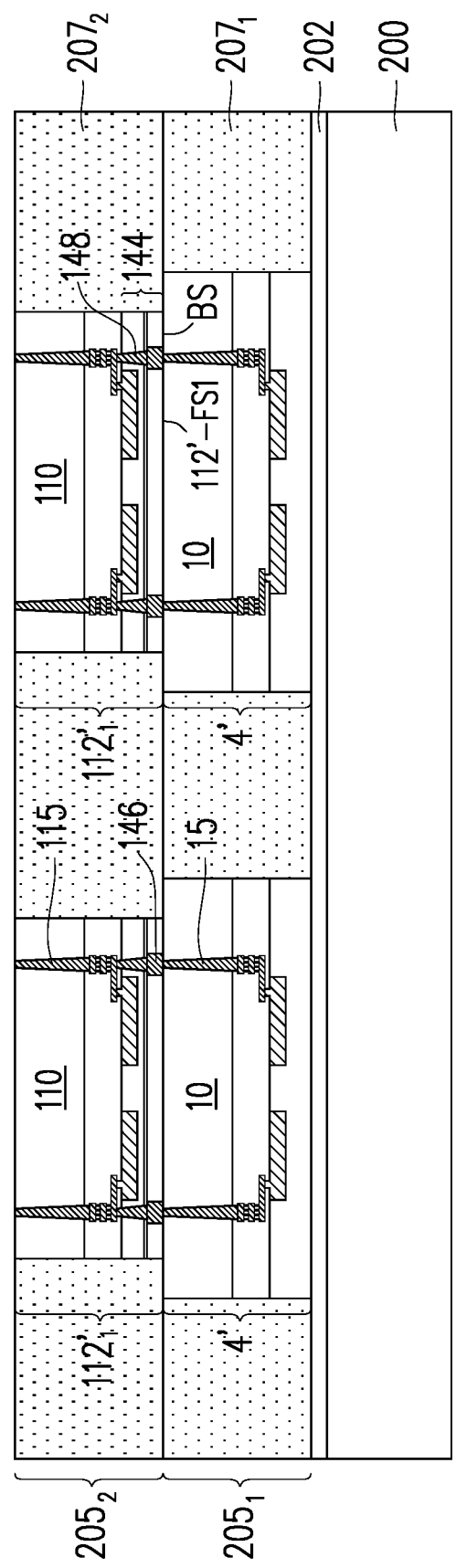

Referring to FIG. 8E, device dies $112_1$' are bonded to the device dies 4'. The device dies $112_1$' and the device dies 4' are singulated from different wafers, and may be different in functions and properties. For example, the device die 4' is a logic die (e.g., a system-on-a-chip (SoC), a central processing unit (CPU), a graphics processing unit (GPU), etc.). The device die $112_1$' is a memory die (e.g., a dynamic random access memory (DRAM) die, a static random access memory (SRAM) die, a synchronous dynamic random access memory (SDRAM), a NAND flash, etc.). The device die $112_1$' may be similar to the device die 112, with similar features of the device dies 112 and $112_1$' being referred to with similar numerical references. The device dies $112_1$' may be tested before stacked on the device dies 4', so that only known good die (KGD) are used for die stacking. In some embodiments, the device dies $112_1$' may be disposed on the device dies 4' in a face-to-back configuration. For example, the front surface 112'-FS1 of the device dies $112_1$' face toward the back surface BS of the device dies 4'. The bonding structures 150 of the device dies $112_1$' the is bonded to the substrate 10 and the TSVs 15 of the device dies 4'.

The device dies $112_1$' may be bonded to the device dies 4' through a bonding process such as, a hybrid bonding process, a fusion bonding process, or a combination thereof. For example, a bonding interface between the device die $112_1$' and the device die 4' includes metal-to-metal bonding (e.g., copper-to-copper bonding), metal-to-dielectric bonding (e.g., copper-to-oxide bonding), oxide-to-semiconductor bonding (e.g., oxide-to-silicon bonding), dielectric-to-dielectric bonding (e.g., oxide-to-oxide bonding), adhesive bonding, any combinations thereof, and/or the like. For example, the bonding pads 146 of the device dies $112_1$' are bonded to the TSVs 15 of the device die 4' through metal-to-metal bonding, and an insulating layer 144 of the device dies $112_1$' is bonded to the substrates 10 of the device dies 4' through dielectric-to-semiconductor bonding. In some embodiments, the TSVs 15 of the device die 4' and the bond pads 146 of the device dies $112_1$' may comprise a same material. In other embodiments, the TSVs 15 of the device die 4' and the bond pads 146 of the device dies $112_1$' may comprise different materials.

In some embodiments, after bonding the device dies $112_1$' to the device die 4', an annealing process may be performed to strengthen the bond between the IC device dies $112_1$' and the device die 4'. The bond between the bond pads 146 of the device dies $112_1$' and the TSVs 15 of the device die 4' provides an electrical connection between the device die 4' and the device dies $112_1$'.

Referring further to FIG. 8E, the device dies $112_1$' are encapsulated in an encapsulant $207_2$ is formed over the device dies $112_1$'. In some embodiments, the encapsulant $207_2$ may be formed using similar material and methods as the encapsulant $207_1$, and the description is not repeated herein. The device dies $112_1$', and the encapsulant $207_2$ form a tier 2 structure $205_2$ over the tier 1 structure $205_1$.

Figure 8F:
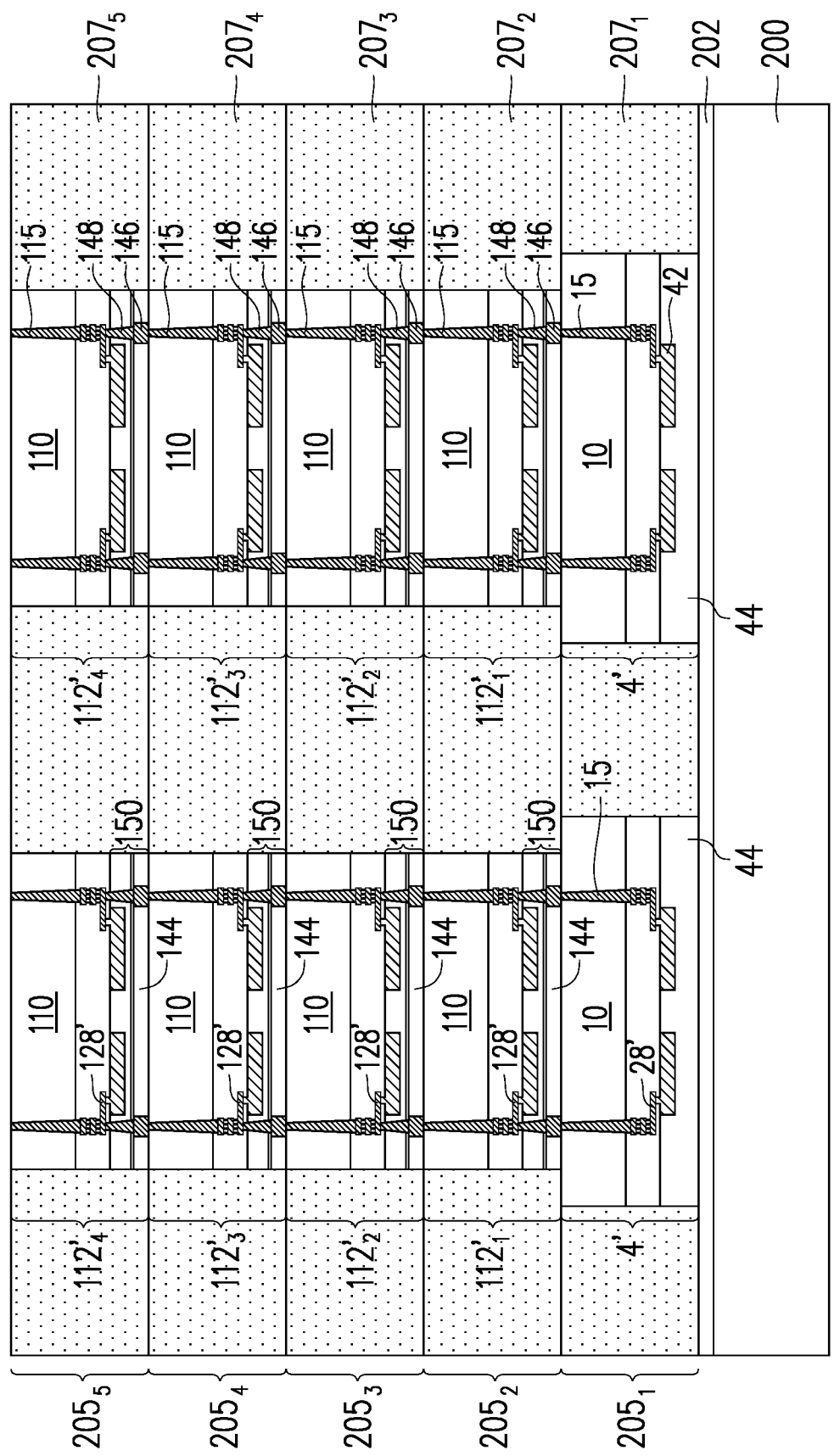

Referring further to FIG. 8F, a tier 3 structure $205_3$, a tier 4 structure $205_4$, and a tier 5 structure $205_5$ are formed over the tier 2 structure $205_2$. The tier 3 structure $205_3$ comprises device dies $112_2$', and the encapsulant $207_3$. The tier 4 structure $205_4$ comprises device dies $112_3$', and the encapsulant $207_4$. The tier 5 structure $205_5$ comprises device dies $112_4$', and the encapsulant $207_5$. In some embodiments, the device dies $112_2$', $112_3$' and $112_4$' may be similar to the device dies $112_1$', with similar features of the device dies $112_2$', $112_3$' and $112_4$' and the device dies $112_1$' being referred to with similar numerical references. In some embodiments, the encapsulants $207_3$, $207_4$, and $207_5$ may be formed using similar material and methods as the encapsulant $207_1$, and the description is not repeated herein. In some embodiments, the tier 3 structure $205_3$, the tier 4 structure $205_4$, and the tier 5 structure $205_5$ may be formed using similar methods as the tier 2 structure $205_2$ described above, and the description is not repeated herein.

In some embodiments, before the device dies $112_1$' are bonded to the device dies 4', a bonding layer is formed on the top surfaces of the devices dies 4' and the encapsulant $207_1$. Similarly, before the device dies $112_2$', $112_3$', or $112_4$' are bonded to the device dies $112_1$', $112_2$', or $112_3$', a bonding layer may be formed on the devices dies $112_1$', $112_2$', or $112_3$' and on the encapsulant $207_2$, $207_3$, or $207_4$, respectively. The bonding layer comprises an insulating layer formed on the devices dies 4' or $112_1$', and bond pads embedded in the insulating layer to electrically connected to the TSVs 15, or 115. The bond pads may be formed through a single damascene process, for example. In some embodiments, top surfaces of the bond pads are coplanar with a top surface of the insulating layer in a same bonding layer. The device dies $112_1$', $112_2$', $112_3$', or $112_4$' may be bonded to the bonding layer on the device dies 4', $112_1$', $112_2$', or $112_3$' through a bonding process such as, a hybrid bonding process, respectively. In other words, the insulating layer 144 of the device dies $112_1$', $112_2$', $112_3$', or $112_4$' is bonded to the insulating layer formed on the back surface BS of the device dies 4', $112_1$', $112_2$', or $112_3$'. In addition, the bond pads 146 of the device dies $112_1$', $112_2$', $112_3$', or $112_4$' are bonded to the bond pads formed on the back surface BS of the device dies 4', $112_1$', $112_2$', or $112_3$', respectively.

Figure 8G:
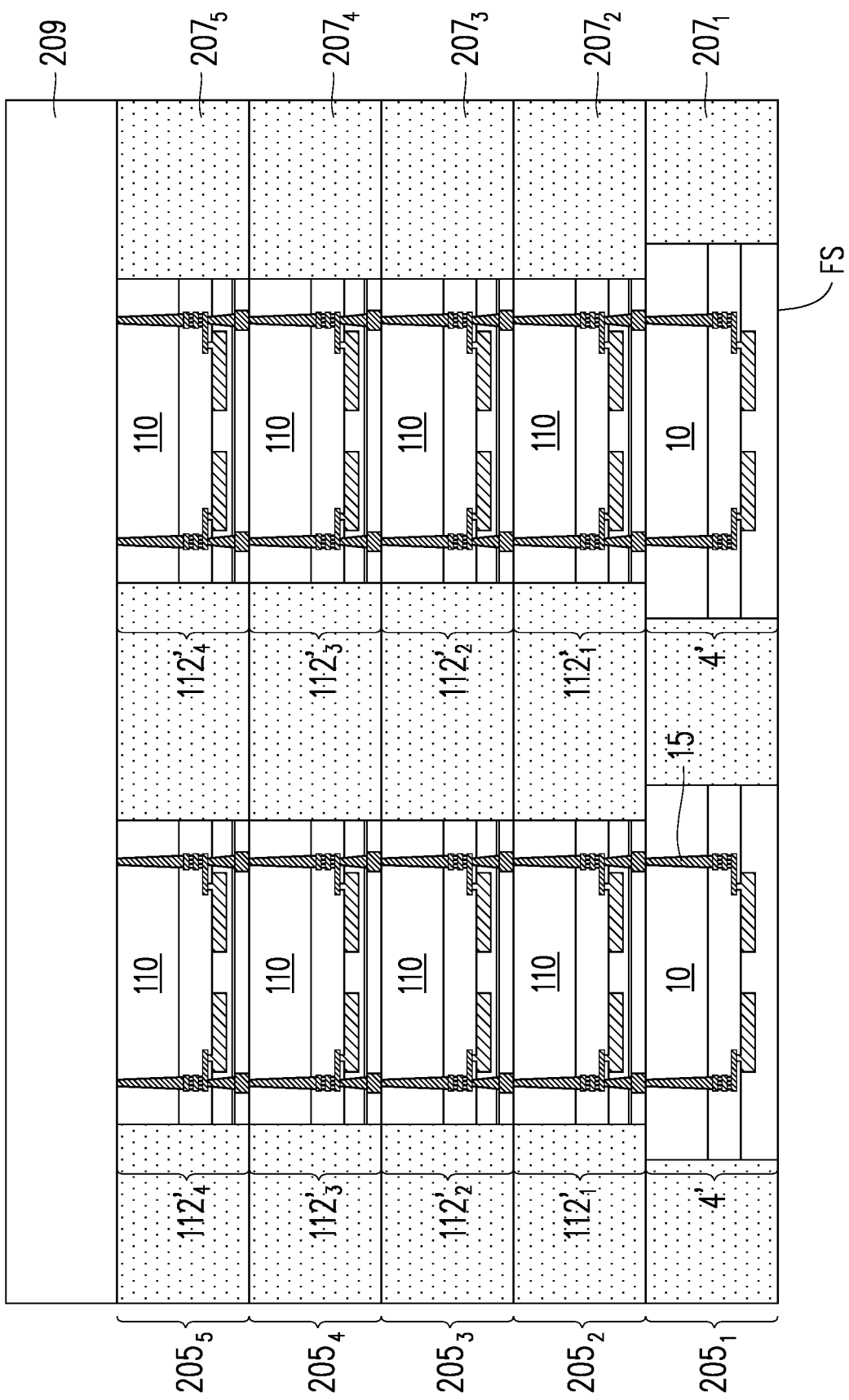

Referring to FIG. 8G, another temporary carrier 209 is optionally attached to the tier 5 structure $205_5$ opposite to the temporary carrier 200. In some embodiments, before attaching the temporary carrier 209, other processes may be performed one the tier 5 structure 205 depending on the design requirements. A de-bonding process is performed to release the temporary carrier 200 form the overlying structure, such that the front surface FS of the device dies 4' are exposed. In some embodiments, after the de-bonding of the temporary carrier 200, the front surface FS of the device dies 4' are cleaned for further processing.

Figure 8H:
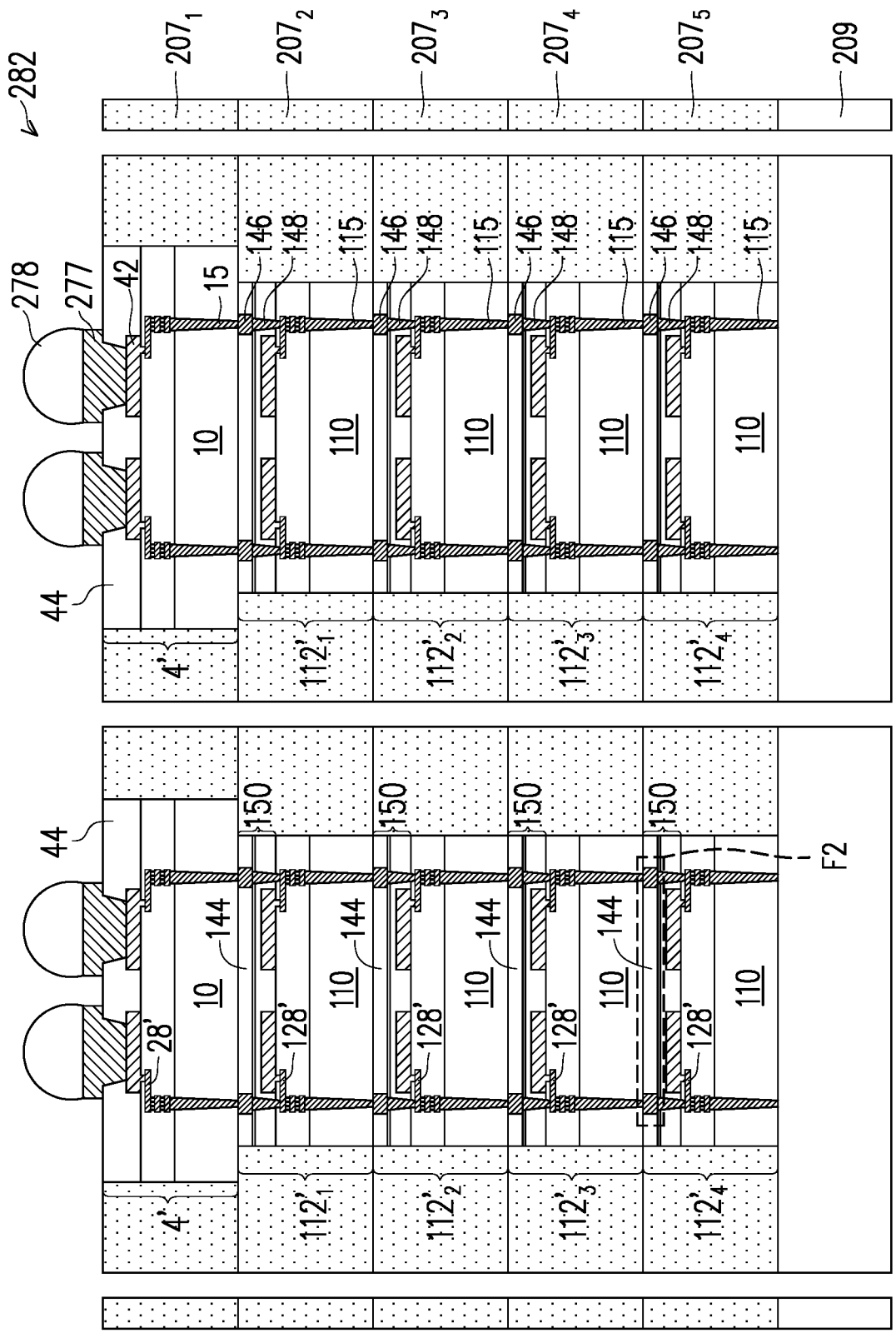

Referring to FIG. 8H, UBMs 277 are formed over and electrically coupled to the respective metal pads 42 of the device dies 4' and electrical connectors 278 are formed over and electrically coupled to the UBMs 277. In some embodiments, openings are formed through the insulating layers 44 to expose the metal pads 42 and suitable conductive materials are deposited in the openings to form the UBMs 277. The materials and the formations of the UBMs 277 and the electrical connectors 278 may be similar to the UBMs 77 and the electrical connectors 78, and hence the details are not repeated herein.

Referring to FIG. 8H, after forming the electrical connectors 278, the resulting structure is singulated into a plurality of packages 282, such that each package 282 comprises the device die 4' with the respective stack of device dies $112_1$'-$112_4$'. In some embodiments, the singulation process may comprise sawing, laser ablation, etching, a combination thereof, or the like. In other embodiments, the temporary carrier 209 may be removed before performing the singulation process. The temporary carrier 209 may be removed using a CMP process, a grinding process, an etching process, a combination thereof, or the like.

In some embodiments, the package 282 includes one or more memory dies, such as a stack of memory dies (e.g., DRAM dies, SRAM dies, high-bandwidth memory (HBM) dies, hybrid memory cubes (HMC) dies, or the like). In the stack of memory dies embodiments, the packages 282 may include both memory dies and a memory controller, such as, for example, a stack of four or eight memory dies with a memory controller. Also, in some embodiments, the device dies 4' and $112_1$'-$112_4$' of the package 282 may be different sizes (e.g., different heights and/or surface areas), and in other embodiments, the dies 88 may be the same size (e.g., same heights and/or surface areas).

FIGS. 9A to 9E is a cross-sectional view of intermediate stages in the manufacturing of a package having device dies bonded through face-to-back bonding in accordance with some embodiments of the present disclosure. To highlight differences between the embodiment illustrated in FIGS. 9A-9E and the embodiment illustrated in FIGS. 8A-8H, the common features of these embodiments are labeled by same numerical references. Furthermore, the detailed descriptions of the common features (described above with reference to FIGS. 8A-8H) are not repeated herein.

Figure 9A:
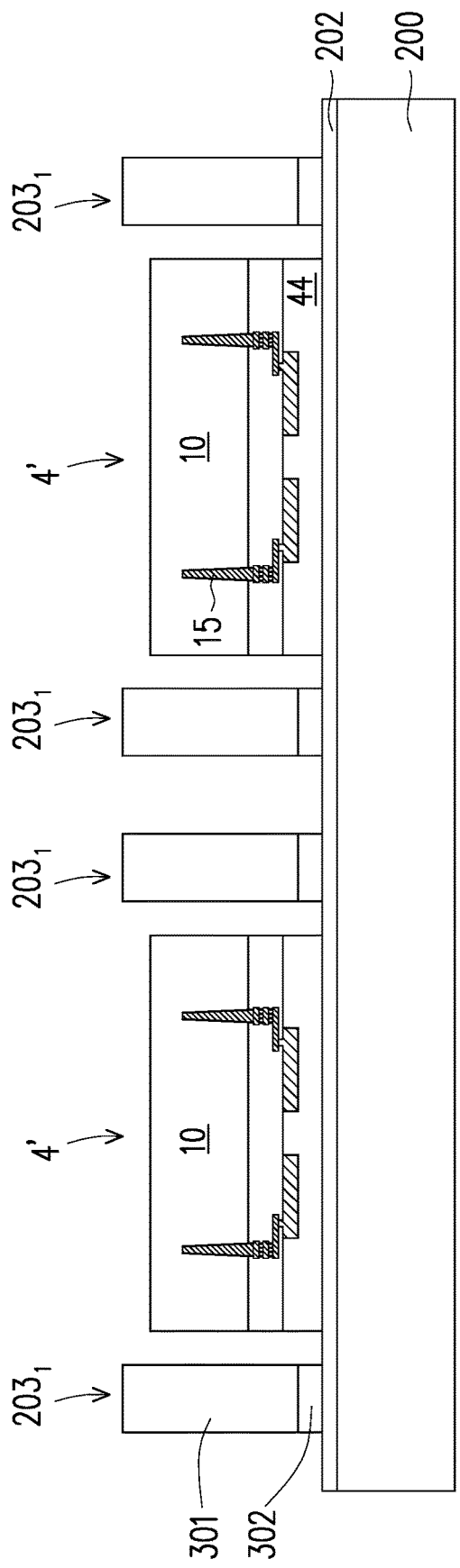
FIGS. 9A to 9E is a cross-sectional view of intermediate stages in the manufacturing of a package having device dies bonded through face-to-back bonding in accordance with some embodiments of the present disclosure.

Referring to FIG. 9A, dummy dies $203_1$ are placed on a temporary carrier 200, such that each device die 4' is interposed between adjacent dummy dies $203_1$. In some embodiments, the dummy dies $203_1$ may comprise a same material as the substrate 10 of the device die 4'. In some embodiments, the dummy dies $203_1$ may not comprise active and/or passive devices, and may not provide additional electrical functionality to the resulting package 382 (see FIG. 9E). In some embodiments, each dummy die $203_1$ may comprise a substrate 301 and an insulating layer 301 on one side. In some embodiments, the substrate 301 and the insulating layer 302 may be formed using similar materials and methods as the substrate 10 and the insulating layer 44 described above, and description is not repeated herein.

Figure 9B:
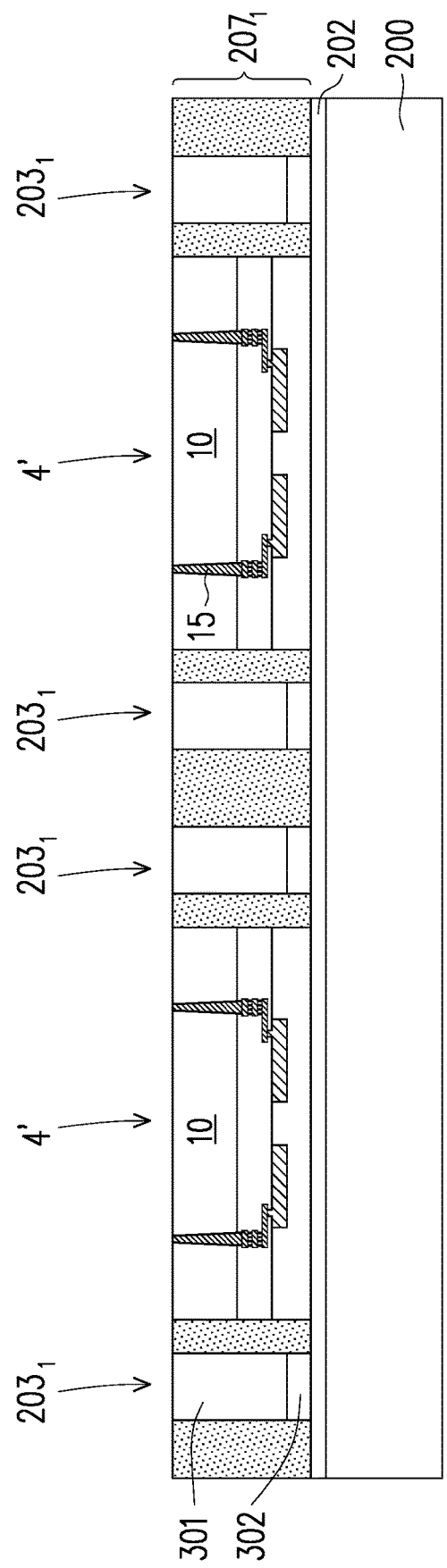

Referring to FIG. 9B, the device dies 4' and the dummy dies $203_1$ are encapsulated in an encapsulant $207_1$. The device dies 4', the dummy dies $203_1$, and the encapsulant $207_1$ form a tier 1 structure $305_1$ over the carrier 115.

Figure 9C:
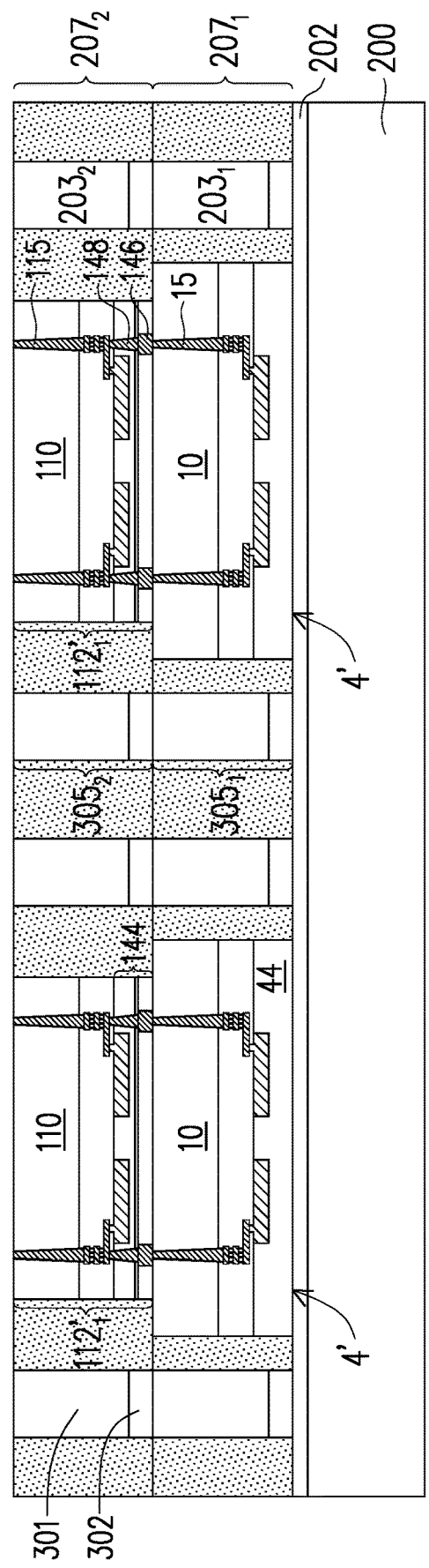

Referring to FIG. 9C, the device dies $112_1$' are bonded to the device dies 4', and dummy dies $203_2$ are bonded to the dummy dies $203_1$. Subsequently, the device dies $112_1'$ and the dummy dies $203_2$ are encapsulated in an encapsulant $207_2$. In some embodiments, the dummy dies $203_2$ may be formed using similar materials and methods as the dummy dies $203_1$ described above, and the description is not repeated herein. In some embodiments, the dummy dies $203_2$ may be bonded to the dummy dies $203_1$ by bonding the insulator layers 302 of the dummy dies $203_2$ to the substrate 301 of the dummy dies $203_1$ using a direct bonding method, such as dielectric-to-semiconductor bonding. In some embodiments, surface treatment processes may be performed on the insulating layers 302 of the dummy dies $203_1$ and the substrate 301 of the dummy dies $203_2$ prior to bonding the insulating layers 302 to the substrate 301. Subsequently, an annealing process may be performed to strengthen the bond between the insulating layers 302 of the dummy dies $203_2$ and the substrate 301 of the dummy dies $203_1$. The device dies $112_2$, the dummy dies $203_2$, and the encapsulant $207_2$ form a tier 2 structure $305_2$ over the tier 1 structure $305_1$.

Figure 9D:
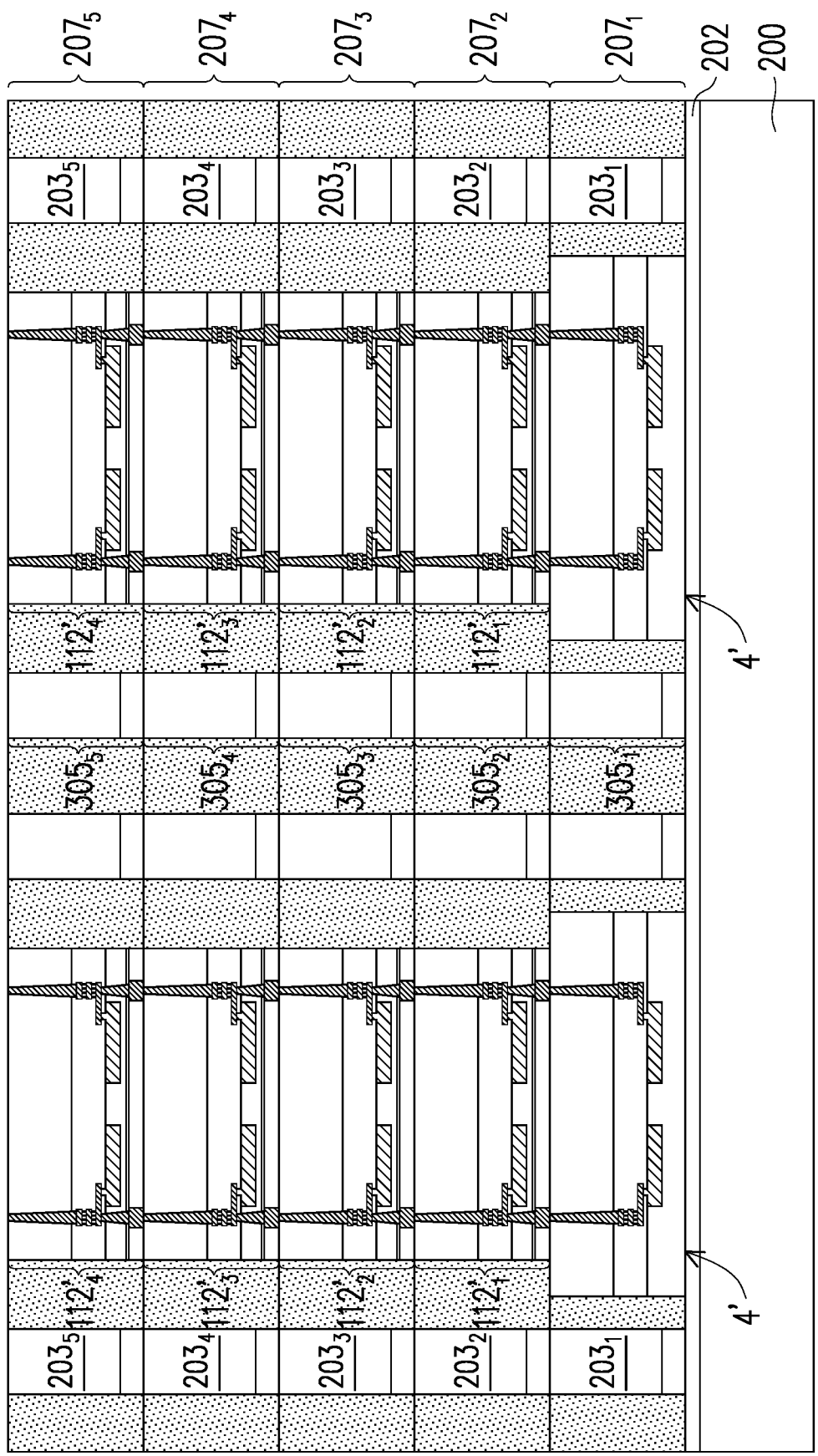

Referring to FIG. 9D, a tier 3 structure $305_3$, a tier 4 structure $305_4$, and a tier 5 structure $305_5$ are formed over the tier 2 structure $305_2$. The tier 3 structure $305_3$ comprises device dies $112_2'$, dummy dies $203_3$, and the encapsulant $207_3$. The tier 4 structure $305_4$ comprises device dies $112_3'$, dummy dies $203_4$, and the encapsulant $207_4$. The tier 5 structure $305_5$ comprises device dies $112_{4'}$, dummy dies $203_5$, and the encapsulant $207_5$. In some embodiments, the dummy dies $203_3$, $203_4$, and $203_5$ may be similar to the dummy dies $203_1$, with similar features of the dummy dies $203_2$, $203_3$, $203_4$, and $203_5$, and the dummy dies $203_1$ being referred to with similar numerical references. In some embodiments, the encapsulants $207_3$, $207_4$, and $207_5$ may be formed using similar material and methods as the encapsulant $207_1$, and the description is not repeated herein. In some embodiments, the tier 3 structure $305_3$, the tier 4 structure $305_4$, and the tier 5 structure $305_5$ may be formed using similar methods as the tier 2 structure $305_2$ described above, and the description is not repeated herein.

Figure 9E:
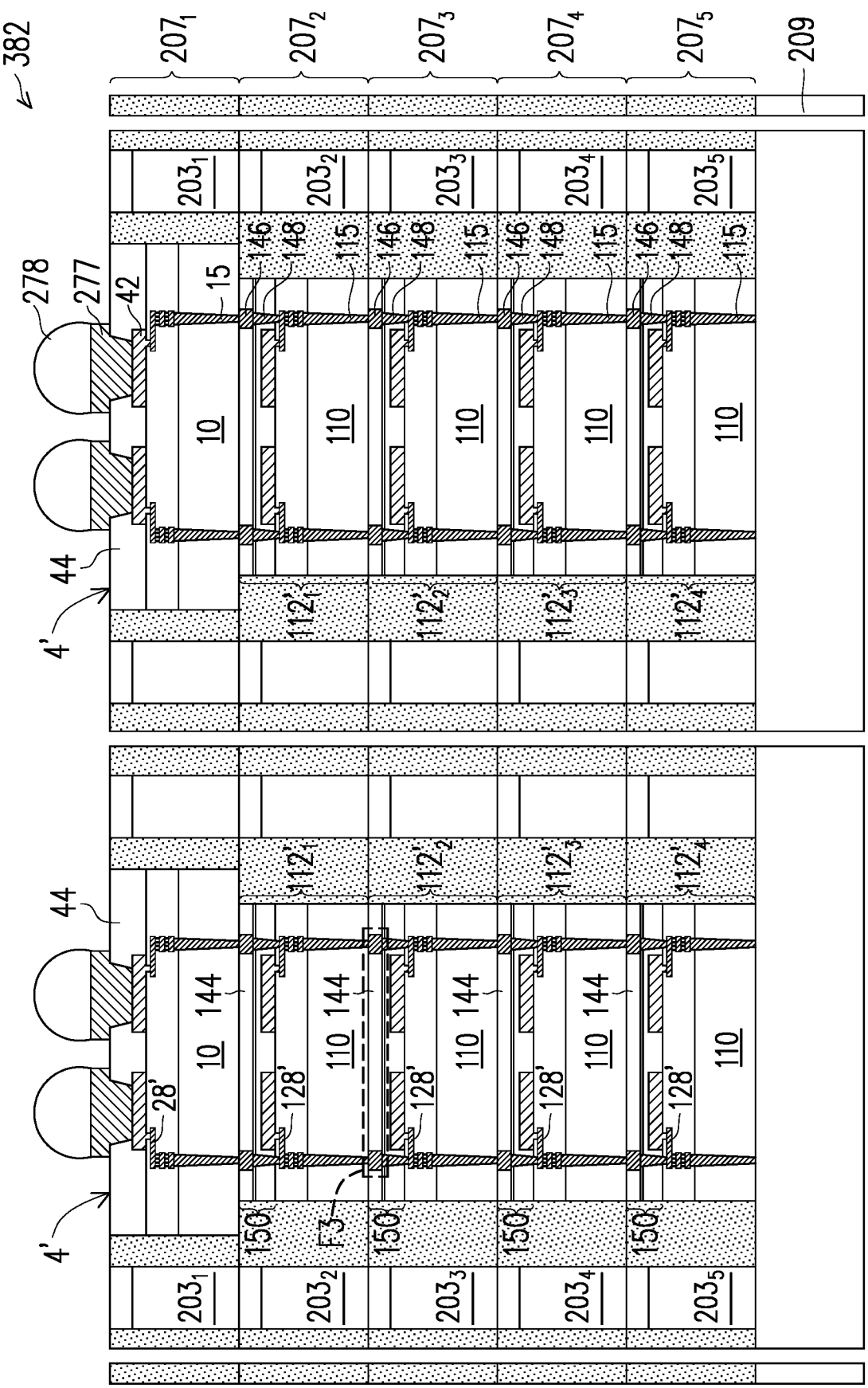

Referring to FIG. 9E, after another temporary carrier 209 is optionally attached to the tier 5 structure $305_5$ opposite to the temporary carrier 200, the temporary carrier 200 is removed. UBMs 277 and electrical connectors 278 are formed over and electrically coupled to the respective metal pads 42 of the device dies 4' as described above with reference to FIGS. 8G and 8H, and the description is not repeated herein. The resulting structure is singulated into a plurality of packages 382, such that each package 382 comprises the device die 4', the dummy dies $203_1$-$203_5$, and the respective stack of device dies $112_1'$-$112_4'$.

In some embodiments, the package 382 includes one or more memory dies, such as a stack of memory dies (e.g., DRAM dies, SRAM dies, high-bandwidth memory (HBM) dies, hybrid memory cubes (HMC) dies, or the like). In the stack of memory dies embodiments, the package 382 may include both memory dies and a memory controller, such as, for example, a stack of four or eight memory dies with a memory controller. Also, in some embodiments, the device dies 4', $112_1'$-$112_4'$ and the dummy dies $203_1$-$203_5$ of the packages 382 may be different sizes (e.g., different heights and/or surface areas), and in other embodiments, the device dies 4', $112_1'$-$112_4'$ and the dummy dies $203_1$-$203_5$ may be the same size (e.g., same heights and/or surface areas).

Figure 10:
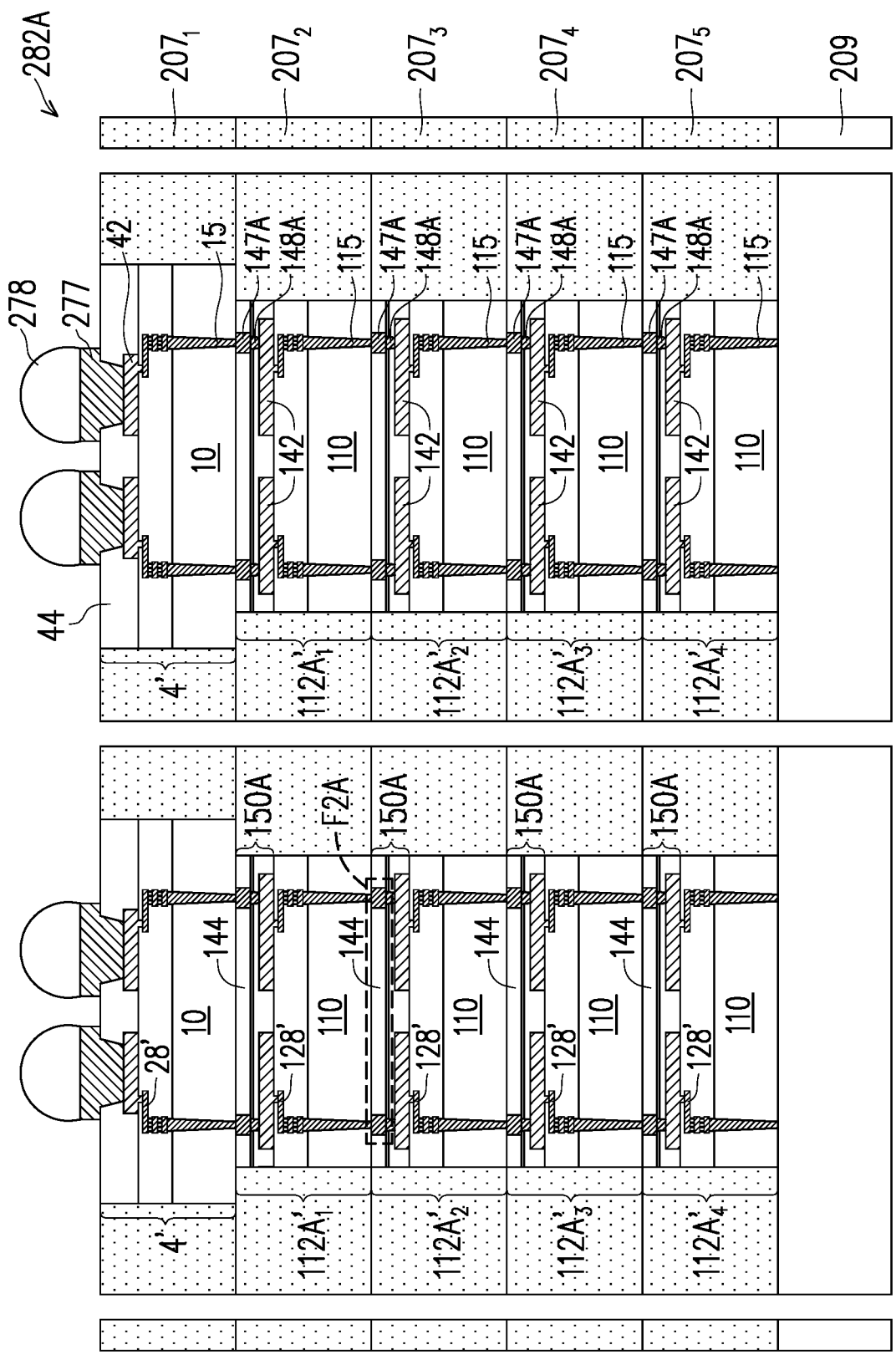
FIG. 10 is a cross-sectional view of intermediate stages in the manufacturing of a package having device dies bonded through face-to-back bonding in accordance with other some embodiments of the present disclosure.

FIG. 10 illustrates the package 282A including a device die 4', and device dies $112A_1'$-$112A_4'$. The device die 4' may be similar to the device die 4' as described above with reference to FIGS. 7A and 7B, and the description is not repeated herein. The device dies $112A_1'$-$112A_4'$ may be similar to the 112A' as described above with reference to FIG. 5, and the description is not repeated herein.

In some embodiments, the package 282A includes one or more memory dies, such as a stack of memory dies (e.g., DRAM dies, SRAM dies, high-bandwidth memory (HBM) dies, hybrid memory cubes (HMC) dies, or the like). In the stack of memory dies embodiments, the package 282A may include both memory dies and a memory controller, such as, for example, a stack of four or eight memory dies with a memory controller. Also, in some embodiments, the device dies 4', and $112A_1'$-$112A_4'$ of the packages 282 may be different sizes (e.g., different heights and/or surface areas), and in other embodiments, the device dies 4', and $112A_1'$-$112A_4'$ may be the same size (e.g., same heights and/or surface areas).

Figure 11:
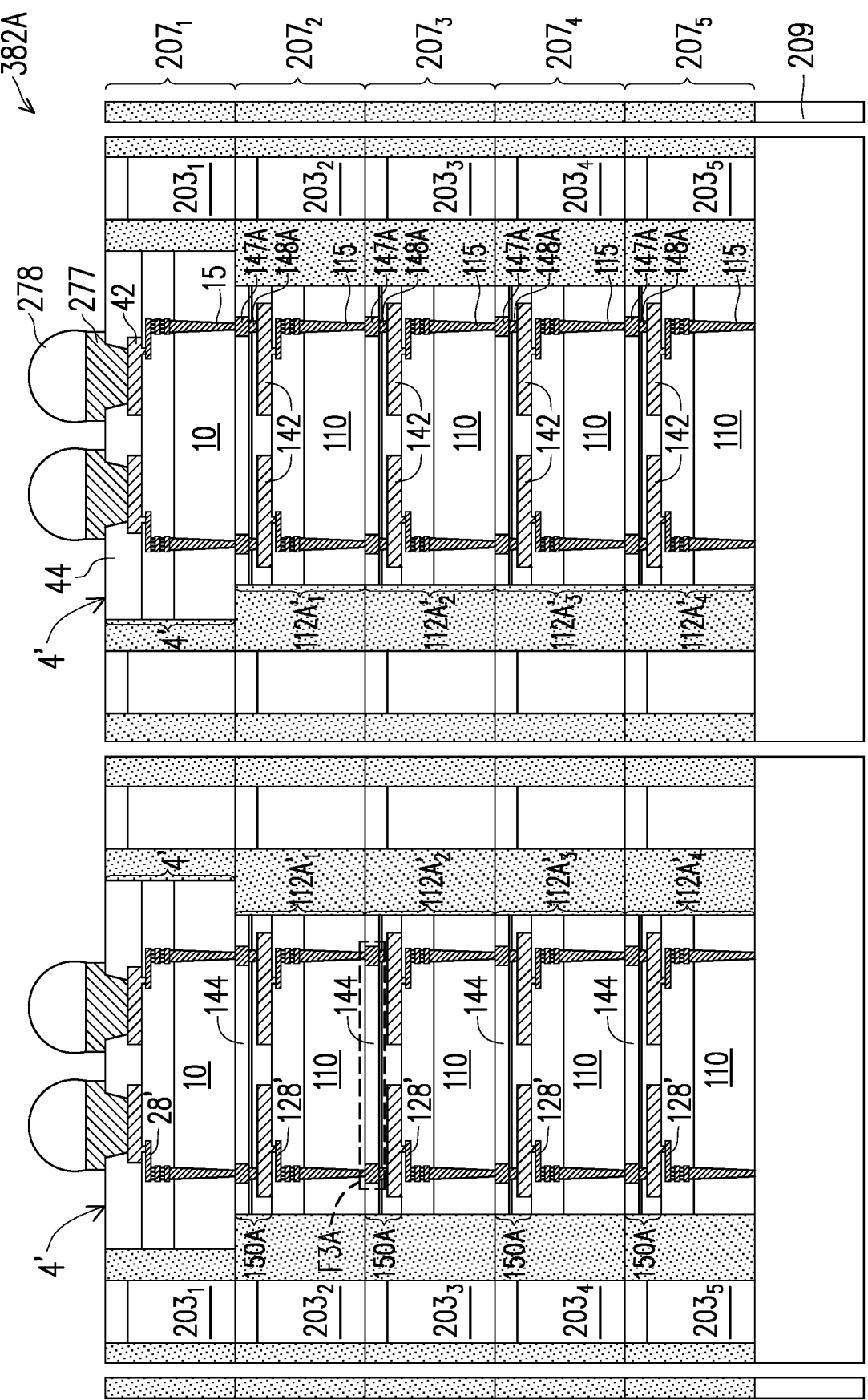
FIG. 11 is a cross-sectional view of intermediate stages in the manufacturing of a package having device dies bonded through face-to-back bonding in accordance with other some embodiments of the present disclosure.

FIG. 11 illustrates the package 382A including a device die 4', dummy dies $203_1$-$203_5$, and device dies $112B_1'$-$112B_4'$. The device die 4' may be similar to the device dies 4' as described above with reference to FIGS. 7A and 7B, the dummy dies $203_1$-$203_5$ may be similar to the dummy dies $203_1$-$203_5$ as described above with reference to FIGS. 9A and 9E, the device dies $112A_1'$-$112A_4'$ may be similar to the 112A' as described above with reference to FIG. 5, and hence the details are not repeated herein.

In some embodiments, the package 382A includes one or more memory dies, such as a stack of memory dies (e.g., DRAM dies, SRAM dies, high-bandwidth memory (HBM) dies, hybrid memory cubes (HMC) dies, or the like). In the stack of memory dies embodiments, the package 382A may include both memory dies and a memory controller, such as, for example, a stack of four or eight memory dies with a memory controller. Also, in some embodiments, the device dies 4', $112A_1'$-$112A_4'$ and the dummy dies $203_1$-$203_5$ of the packages 382A may be different sizes (e.g., different heights and/or surface areas), and in other embodiments, the device dies 4', $112A_1'$-$112A_4'$ and the dummy dies $203_1$-$203_5$ may be the same size (e.g., same heights and/or surface areas).

Referring to FIGS. 8H, 9E, 10 and 11, the packages 282, 382, 282A and 382A further include components F2, F3, F2A, and F3A, respectively. The components F2 and F3 are embedded in the bonding layer (or referred to as a boning structure) 150 of the device die (such as $112_2'$). The components F2 and F3 are formed simultaneously with the formation of the bond pads 146 of the bonding structure 150 of the device die (such as $112_2'$). The bond pads 146 may be connected to the top metal layer 128' of the same device die (such as $112_2'$) through the visa 148, and in contact with the TSVs 115 of the overlying device die (such as $112_1'$).

and the components F2A and F3A are embedded in the bonding layer (or referred to as a boning structure) 150A of the device die (such as $112A_2'$) The components F2A and F3A are formed simultaneously with the formation of the bond pads 147A of the bonding structure 150A of the device die (such as $112A_2'$). The bond pads 147A may be in contact with the top metal layer 128' of the same device die (such as $112A_2'$) through the visa 148A, and in contact with the TSVs 115 of the overlying device die (such as $112A_1'$).

The shapes and sizes of the bond pads 146, or 147A may be similar to the shapes and sizes of the bond pads 146A to 146L as illustrated in some embodiments in FIG. 2A, 3A, 4C, or 4F. Each of the components F2, F2A, F3 and F3A may be a transmission line or a passive device, which may also be a capacitor, an inductor, or the like, as illustrated in some embodiments in FIG. 2B, 3B, 4B, 4D, 4E or 4G.

Each of the packages 282, and 382 may include a plurality of components F2, and F3 in the device dies $112_1'$-$112_4'$, respectively. Each of the packages 282A and 382A may include a plurality of components F3 and F3A in the device dies 112A$_1$'-112A$_4$', respectively. The plurality of components F2, F3, F2A or F3A may be have the same function, or have different function. The plurality of components F2, F3, F2A or F3A may be connected each other through the interconnect and TSVs 115 in the device dies 112$_1$'-112$_4$', or device dies 112A$_1$'-112A$_4$', or not connected each other.

Figure 12:
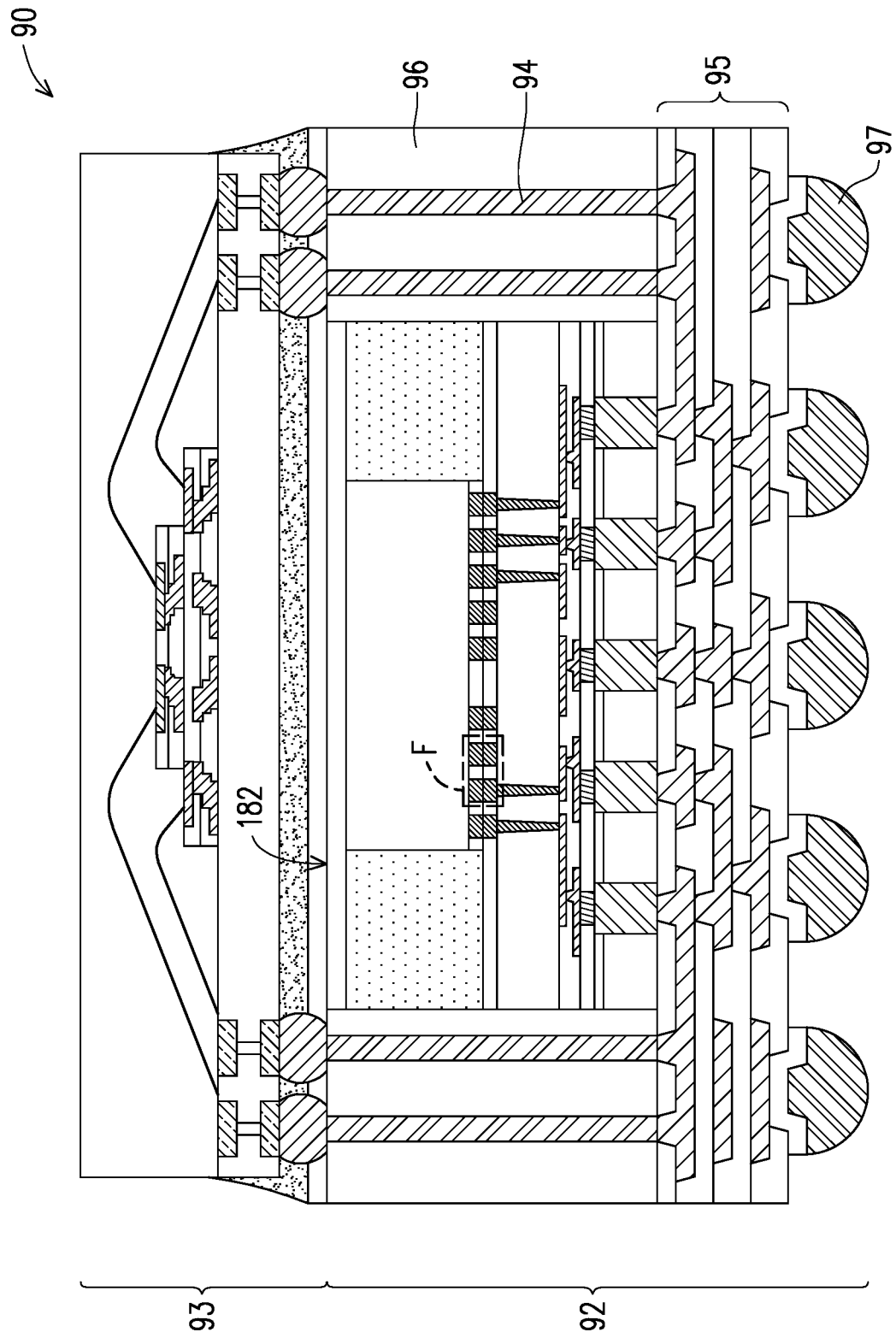
FIG. 12 illustrates a package-on-package (PoP) structure, which has an integrated fan-out (InFO) package bonded with top package.

FIG. 12 illustrates a package-on-package (PoP) structure 90, which has an integrated fan-out (InFO) package 92 bonded with top package 93. The InFO package 92 includes a package 182 embedded therein. The package 182 and through-vias 94 are encapsulated in encapsulating material 96, which may be a molding compound. The package 182 is connected to electrical connectors 97 through RDLs of a RDL structure 95. The package 182 may be include one package or a plurality of packages arranged side-by-side or stacked. The package 182 may be the package 82, 82A, 82B, 282, 382, 282A and/or 382A as described above with reference to FIGS. 1H, 5, 6, 8H, 9E, 10 and 11. The package 182 comprises a component F (such as component F1, F1A, F1B, F2, F3, F2A and F3A described above with reference to FIGS. 1H, 5, 6, 8H, 9E, 10 and 11) embedded therein, which may be a transmission line or a passive device such as a capacitor, an inductor, or the like. The component F embedded in the package 182 may be accessed by the top package 93 or the package components that are bonded to the package 90.

The embodiments of the present disclosure have some advantageous features. By integrating components such as passive devices in the package, no SMD is needed, and the manufacturing cost is saved. It is flexible to design the passive devices in the package.

In some embodiments, a method includes bonding a first device die with a second device die, wherein the second device die is over the first device die, thereby forming a bonding structure in a combined structure comprising the first device die and the second device die, and forming a component in the bonding structure, wherein the component comprises a passive device or a transmission line; and forming a first electrical connector and a second electrical connector electrically coupling to a first end and a second end of the component.

In some embodiments, a method includes providing a first device die, wherein the first device comprises a first bonding layer, the first bonding layer comprises a first insulating layer and a plurality of first bond pads, and the plurality of the first bond pads are embedded in the first insulating layer through a first damascene process; providing a second device die on the first device die, wherein the second device comprises a second bonding layer, the second bonding layer comprises a second insulating layer and a plurality of second bond pads, and the plurality of the second bond pads are embedded in the second insulating layer through a second damascene process; bonding the first device die with the second device die through hybrid bonding the first bonding layer and the second bonding layer, thereby forming a component, wherein the component comprises a passive device or a transmission line; and forming a first electrical connector and a second electrical connector electrically coupling to a first end and a second end of the component.

In some embodiments, a package includes a first device die; a second device die over and bonded to the first device die through a bonding structure thereof; a component in the bonding structure, wherein the component comprises a passive device or a transmission line; and a first electrical connector and a second electrical connector electrically coupling to a first terminal and a second terminal of the component.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package, comprising:
    a first die;
    a second die over and bonded to the first die through a bonding structure thereof; and
    an inductor in the bonding structure, wherein the inductor comprises a spiral pattern parallel to top surfaces of the first die and the second die, and the spiral pattern comprises at least a turn;
    a dielectric layer on the first die and laterally encapsulating the second die;
    a redistribution line (RDL) structure on the dielectric layer and the second die;
    a first through via extending through the dielectric layer connecting the first die and the RDL structure; and
    a second through via in the second die connecting the second die and the RDL structure.

2. The package of claim 1, wherein the at least a turn comprises a first turn, and the first turn comprises:
    a first part on the first die parallel to the top surfaces of the first die and the second die; and
    a second part on the second die parallel to the top surfaces of the first die and the second die,
    wherein the first part is overlap with and bonded to the second part.

3. The package of claim 2, wherein the bonding structure comprises:
    a plurality of first bond pad on the first die; and
    a plurality of second bond pad on the second die,
    wherein the plurality of first bond pad and the first part of the first turn are at a same level, and the plurality of second bond pad and the second part of the first turn are at a same level.

4. The package of claim 3, wherein the bonding structure comprises:
    a first insulating layer on the first die; and
    a second insulating layer on the second die,
    wherein the plurality of first bond pad and the first part of the first turn are formed in the first insulating layer, and the plurality of second bond pad and the second part of the first turn are formed in the second insulating layer.

5. The package of claim 2, wherein the at least a turn comprises:
    a second turn connecting the first turn, wherein the second turn formed in the first die and parallel to the top surface of the first die.

6. The package of claim 5, wherein the at least a turn comprises:
    a third turn connecting the first turn, wherein the third turn formed in in the second die and parallel to the top surface of the second die, and the first turn is sandwiched between the second turn and the third turn.

7. The package of claim 1, further comprising:
a plurality of electrical connectors on the redistribution line (RDL) structure.

8. A package, comprising:
a first die;
a second die over and bonded to the first die through a bonding structure thereof;
at least a capacitor in the bonding structure,
wherein the at least a capacitor comprises a first capacitor and the first capacitor comprises:
   a first plate, a second plate and an insulating film between the first plate and the second plate arranged in a same plane parallel to top surfaces of the first die and the second die,
a dielectric layer on the first die and laterally encapsulating the second die;
a redistribution line (RDL) structure on the dielectric layer and the second die;
a first through via extending through the dielectric layer connecting the first die and the RDL structure; and
a second through via in the second die connecting the second die and the RDL structure.

9. The package of claim 8, wherein the at least a capacitor comprises:
a second capacitor, wherein the first capacitor and the second capacitor are arranged in a same level.

10. The package of claim 8, wherein:
the first plate comprises a first portion on the first die and a second portion on the second die, wherein the first portion is bonded to the second portion,
the second plate comprises a third portion on the first die and a fourth portion on the second die, wherein the third portion is bonded to the fourth portion,
the insulating film comprises a first portion on the first die and a second portion on the second die, and
the first portion of the insulating film is bonded to the second portion of the insulating film.

11. The package of claim 10, wherein the bonding structure comprises:
a plurality of first bond pad on the first die; and
a plurality of second bond pad on the second die,
wherein the plurality of first bond pad, the first part and the second part of the first plate are located at a same level, and the plurality of second bond pad, the third part and the fourth part of the second plate are located at a same level.

12. The package of claim 11, wherein the bonding structure comprises:
a first insulating layer on the first die; and
a second insulating layer on the second die,
wherein the first insulating layer and the first portion of the insulating film are located at a same level, and the second insulating layer and the second portion of the insulating film are located at a same level.

13. The package of claim 8, further comprising:
a plurality of electrical connectors on the redistribution line (RDL) structure.

14. The package of claim 8, wherein the first plate is disposed laterally aside the second plate.

15. The package of claim 8, wherein the first plate is arranged offset from the second plate.

16. The method of claim 8, wherein the insulating film is disposed between a first sidewall of the first plate and a second sidewall of the second plate.

17. A method of fabricating a package, comprising:
providing a first die and a second die;
bonding the first die with the second die, thereby forming a bonding structure in a combined structure comprising the first die and the second die, and forming an inductor comprises forming a spiral pattern parallel to top surfaces of the first die and the second die, and the forming the spiral pattern comprises forming at least a turn,
forming a dielectric layer on the first die and laterally encapsulating the second die;
forming a redistribution line (RDL) structure on the dielectric layer and the second die;
forming a first through via extending through the dielectric layer connecting the first die and the RDL structure; and
forming a second through via in the second die connecting the second die and the RDL.

18. The method of claim 17, wherein the forming the at least a turn comprises:
forming a first turn, comprises:
   forming a first part on the first die parallel to the top surfaces of the first die and the second die; and
   forming a second part on the second die parallel to the top surfaces of the first die and the second die,
   wherein the first part is overlap with and bonded to the second part.

19. The method of claim 17, wherein the forming the at least a turn further comprises:
forming a second turn connecting the first turn, wherein the second turn formed in the first die and parallel to the top surface of the first die; and
forming a third turn connecting the first turn, wherein the third turn formed in in the second die and parallel to the top surface of the second die, and the first turn is sandwiched between the second turn and the third turn.

20. The method of claim 17, further comprising:
forming a plurality of electrical connectors on the redistribution line (RDL) structure.

* * * * *